(12) United States Patent
     Kawai

(10) Patent No.: US 10,014,399 B1
(45) Date of Patent: Jul. 3, 2018

(54) HETERO-JUNCTION BIPOLAR TRANSISTOR AND ELECTRIC DEVICE

(71) Applicant: POWDEC K.K., Oyama-shi, Tochigi (JP)

(72) Inventor: Hiroji Kawai, Oyama (JP)

(73) Assignee: Powdec K.K., Oyama-shi, Tochigi (JP)

( * ) Notice: Subject to any disclaimer, the term of this patent is extended or adjusted under 35 U.S.C. 154(b) by 0 days.

(21) Appl. No.: 15/578,595

(22) PCT Filed: Feb. 3, 2017

(86) PCT No.: PCT/JP2017/003888
    § 371 (c)(1),
    (2) Date: Nov. 30, 2017

(87) PCT Pub. No.: WO2017/135394
    PCT Pub. Date: Aug. 10, 2017

(30) Foreign Application Priority Data

Feb. 4, 2016 (JP) .................................. 2016-019441

(51) Int. Cl.
    *H01L 29/15* (2006.01)
    *H01L 29/737* (2006.01)
    (Continued)

(52) U.S. Cl.
    CPC ...... *H01L 29/7373* (2013.01); *H01L 29/2003* (2013.01); *H01L 29/205* (2013.01)

(58) Field of Classification Search
    CPC ............... H01L 29/7373; H01L 29/205; H01L 29/2003; H01L 29/66242; H01L 29/0817;
    (Continued)

(56) References Cited

U.S. PATENT DOCUMENTS

2009/0162999 A1* 6/2009 Lin ...................... H01L 21/0242
                                                         438/483
2011/0278586 A1* 11/2011 Ando .................. H01L 29/0649
                                                          257/76

FOREIGN PATENT DOCUMENTS

JP          62-042451 A     2/1987
JP        2005-079417 A     3/2005
              (Continued)

OTHER PUBLICATIONS

International Search Report dated Apr. 11, 2017 for corresponding PCT Application No. PCT/JP2017/003888.

*Primary Examiner* — Stephen Bradley
*Assistant Examiner* — Wasiul Haider
(74) *Attorney, Agent, or Firm* — K&L Gates LLP

(57) ABSTRACT

This hetero-junction bipolar transistor includes a first n-type GaN layer, an $Al_xGa_{1-x}N$ layer ($0.1 \leq x \leq 0.5$), an undoped GaN layer having a thickness of not less than 20 nm, a Mg-doped p-type GaN layer having a thickness of not less than 100 nm, and a second n-type GaN layer which are sequentially stacked. The first n-type GaN layer and the $Al_xGa_{1-x}N$ layer form an emitter, the undoped GaN layer and the p-type GaN layer form a base, and the second n-type GaN layer forms a collector. During non-operation, two-dimensional hole gas is formed in a part of the undoped GaN layer near the hetero interface between the $Al_xGa_{1-x}N$ layer and the undoped GaN layer. When the thickness of the p-type GaN layer is b [nm], the hole concentration of the p-type GaN layer is p [$cm^{-3}$], and the concentration of the two-dimensional hole gas is $P_s$ [$cm^{-2}$], $p \times b \times 10^{-7} + P_s \geq 1 \times 10^{13}$ [$cm^{-2}$] is satisfied.

9 Claims, 24 Drawing Sheets

(51) Int. Cl.
*H01L 29/20* (2006.01)
*H01L 29/205* (2006.01)

(58) Field of Classification Search
CPC ....... H01L 29/0821; H01L 2924/13051; H01L 29/737–29/7378
See application file for complete search history.

(56) References Cited

FOREIGN PATENT DOCUMENTS

| | | | |
|---|---|---|---|
| JP | 2007142365 | A | 6/2007 |
| JP | 2008016615 | A | 1/2008 |

* cited by examiner

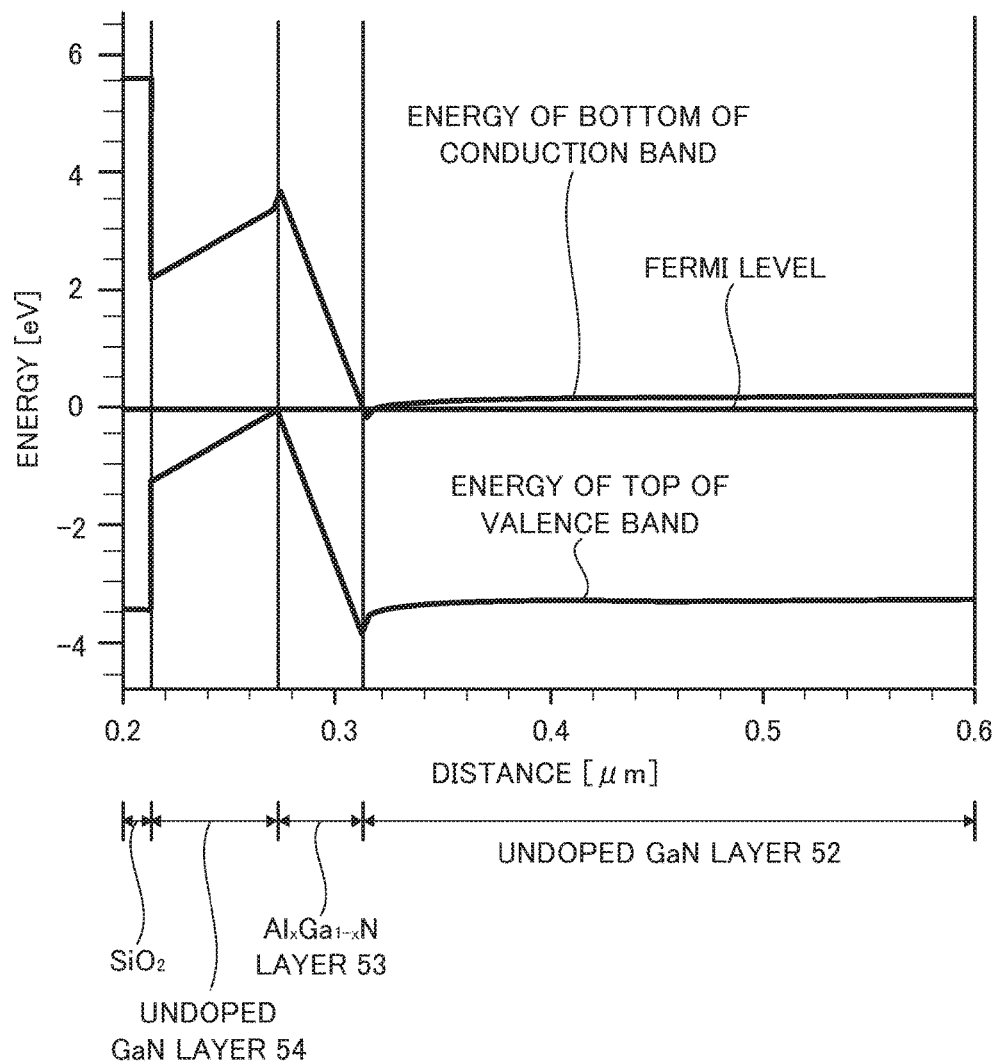

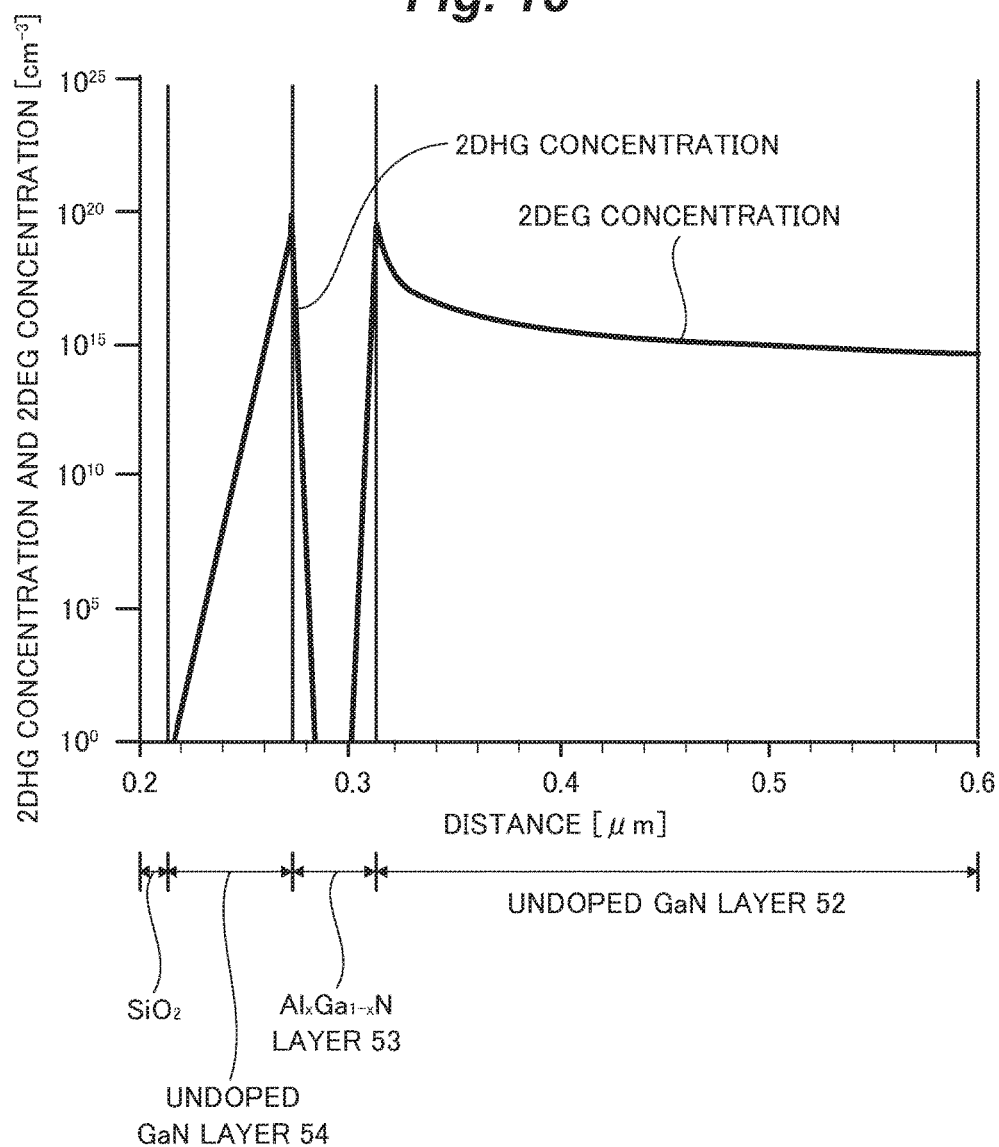

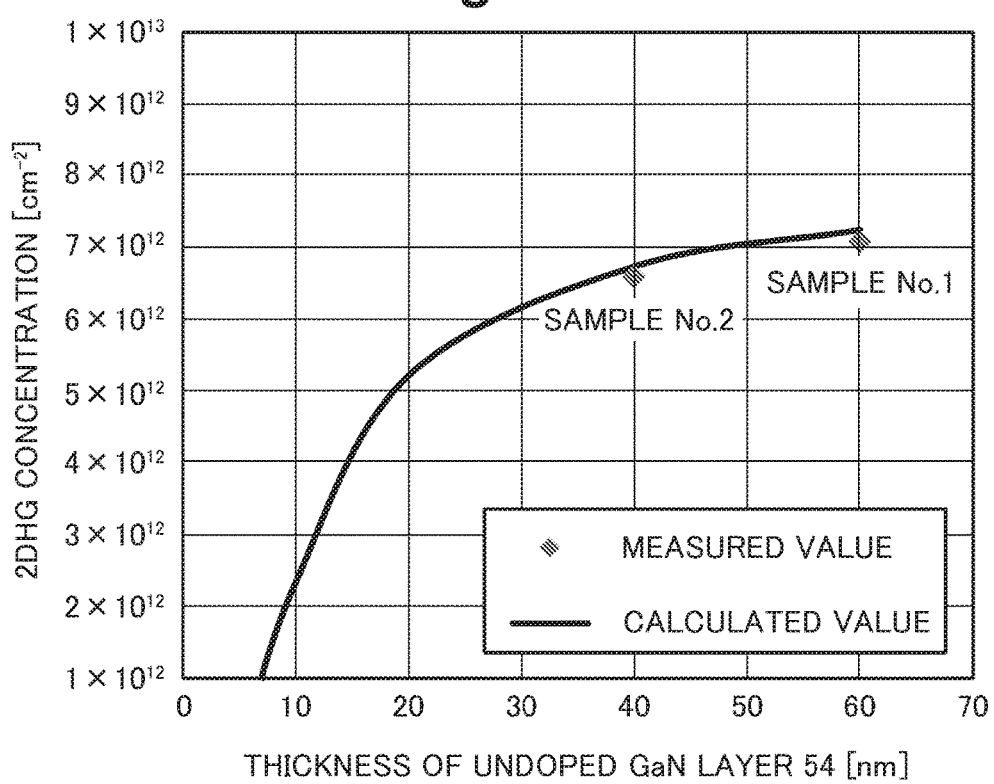

Fig. 20

2DHG CONCENTRATION [cm$^{-2}$]

| t [nm] \ x [%] | 5 | 10 | 15 | 20 | 25 | 30 | 35 | 40 | 45 | 50 |
|---|---|---|---|---|---|---|---|---|---|---|
| 100 | 7.82E-05 | 1.16E+03 | 3.06E+10 | 1.88E+12 | 4.25E+12 | 6.75E+12 | 9.35E+12 | 1.20E+13 | 1.48E+13 | 1.76E+13 |
| 95 | 5.34E-05 | 6.64E+02 | 1.76E+10 | 1.79E+12 | 4.16E+12 | 6.65E+12 | 9.25E+12 | 1.19E+13 | 1.47E+13 | 1.75E+13 |
| 90 | 3.67E-05 | 3.63E+02 | 9.21E+09 | 1.70E+12 | 4.06E+12 | 6.55E+12 | 9.14E+12 | 1.18E+13 | 1.46E+13 | 1.74E+13 |
| 85 | 2.69E-05 | 1.86E+02 | 4.34E+09 | 1.59E+12 | 3.94E+12 | 6.43E+12 | 9.01E+12 | 1.17E+13 | 1.44E+13 | 1.73E+13 |
| 80 | 2.29E-05 | 8.86E+01 | 1.85E+09 | 1.47E+12 | 3.81E+12 | 6.29E+12 | 8.88E+12 | 1.15E+13 | 1.43E+13 | 1.71E+13 |
| 75 | 2.18E-05 | 3.91E+01 | 7.10E+08 | 1.34E+12 | 3.67E+12 | 6.15E+12 | 8.72E+12 | 1.14E+13 | 1.41E+13 | 1.70E+13 |
| 70 | 2.17E-05 | 1.56E+01 | 2.39E+08 | 1.20E+12 | 3.51E+12 | 5.97E+12 | 8.54E+12 | 1.12E+13 | 1.40E+13 | 1.68E+13 |
| 65 | 2.17E-05 | 5.53E+00 | 7.00E+07 | 1.03E+12 | 3.32E+12 | 5.77E+12 | 8.34E+12 | 1.10E+13 | 1.37E+13 | 1.66E+13 |
| 60 | 2.17E-05 | 1.71E+00 | 1.73E+07 | 8.37E+11 | 3.10E+12 | 5.54E+12 | 8.10E+12 | 1.07E+13 | 1.35E+13 | 1.63E+13 |
| 55 | 2.17E-05 | 4.51E-01 | 3.51E+06 | 6.25E+11 | 2.85E+12 | 5.28E+12 | 7.83E+12 | 1.05E+13 | 1.32E+13 | 1.60E+13 |
| 50 | 2.17E-05 | 9.64E-02 | 5.46E+05 | 3.89E+11 | 2.54E+12 | 4.96E+12 | 7.49E+12 | 1.01E+13 | 1.28E+13 | 1.56E+13 |
| 45 | 2.17E-05 | 1.61E-02 | 6.16E+04 | 1.56E+11 | 2.18E+12 | 4.57E+12 | 7.09E+12 | 9.71E+12 | 1.24E+13 | 1.52E+13 |
| 40 | 2.17E-05 | 2.01E-03 | 4.62E+03 | 1.94E+10 | 1.74E+12 | 4.09E+12 | 6.59E+12 | 9.19E+12 | 1.19E+13 | 1.47E+13 |
| 35 | 2.13E-05 | 1.88E-04 | 2.05E+02 | 5.82E+08 | 1.20E+12 | 3.50E+12 | 5.97E+12 | 8.55E+12 | 1.12E+13 | 1.40E+13 |
| 30 | 1.37E-05 | 2.36E-05 | 5.44E+00 | 6.45E+06 | 5.43E+11 | 2.72E+12 | 5.15E+12 | 7.69E+12 | 1.03E+13 | 1.31E+13 |
| 25 | 4.34E-06 | 1.84E-06 | 3.78E-02 | 2.17E+04 | 2.09E+10 | 1.69E+12 | 4.03E+12 | 6.53E+12 | 9.13E+12 | 1.18E+13 |
| 20 | 8.47E-07 | 1.84E-07 | 1.35E-04 | 4.65E+01 | 3.57E+07 | 2.45E+11 | 2.45E+12 | 4.85E+12 | 7.39E+12 | 1.00E+13 |
| 15 | 9.60E-08 | 1.84E-08 | 5.41E-07 | 4.58E-02 | 1.36E+04 | 1.58E+09 | 6.62E+11 | 1.28E+12 | 4.66E+12 | 7.20E+12 |
| 10 | 4.76E-09 | 2.51E-09 | 1.82E-09 | 5.01E-05 | 2.01E-01 | 5.26E+04 | 6.29E+08 | 1.59E+07 | 2.23E+11 | 2.15E+12 |
| 9 | 2.10E-09 | 7.66E-10 | 1.82E-10 | 1.86E-07 | 2.86E-04 | 4.53E+01 | 3.15E+05 | 3.89E+04 | 7.71E+08 | 7.75E+11 |
| 8 | 8.04E-10 | 2.07E-10 | 1.82E-10 | 5.28E-10 | 7.72E-05 | 1.18E-02 | 5.75E+00 | 1.26E+01 | 5.09E+04 | 7.09E+09 |
| 7 | 2.43E-10 | 5.14E-11 | 8.14E-11 | 1.65E-10 | 1.82E-05 | 5.50E-02 | 1.86E+01 | 1.82E+02 | 5.26E+02 | 1.08E+06 |
| 6 | 5.39E-11 | 1.16E-11 | 8.14E-11 | 8.40E-11 | 1.61E-06 | 8.10E-05 | 5.50E-03 | 1.86E-02 | 5.26E-02 | 1.08E+01 |
| 5 | 9.61E-12 | 2.14E-12 | 6.08E-11 | 8.18E-11 | 1.71E-06 | 1.81E-05 | 1.81E-05 | 1.82E-05 | 3.16E-03 | 2.91E-03 |

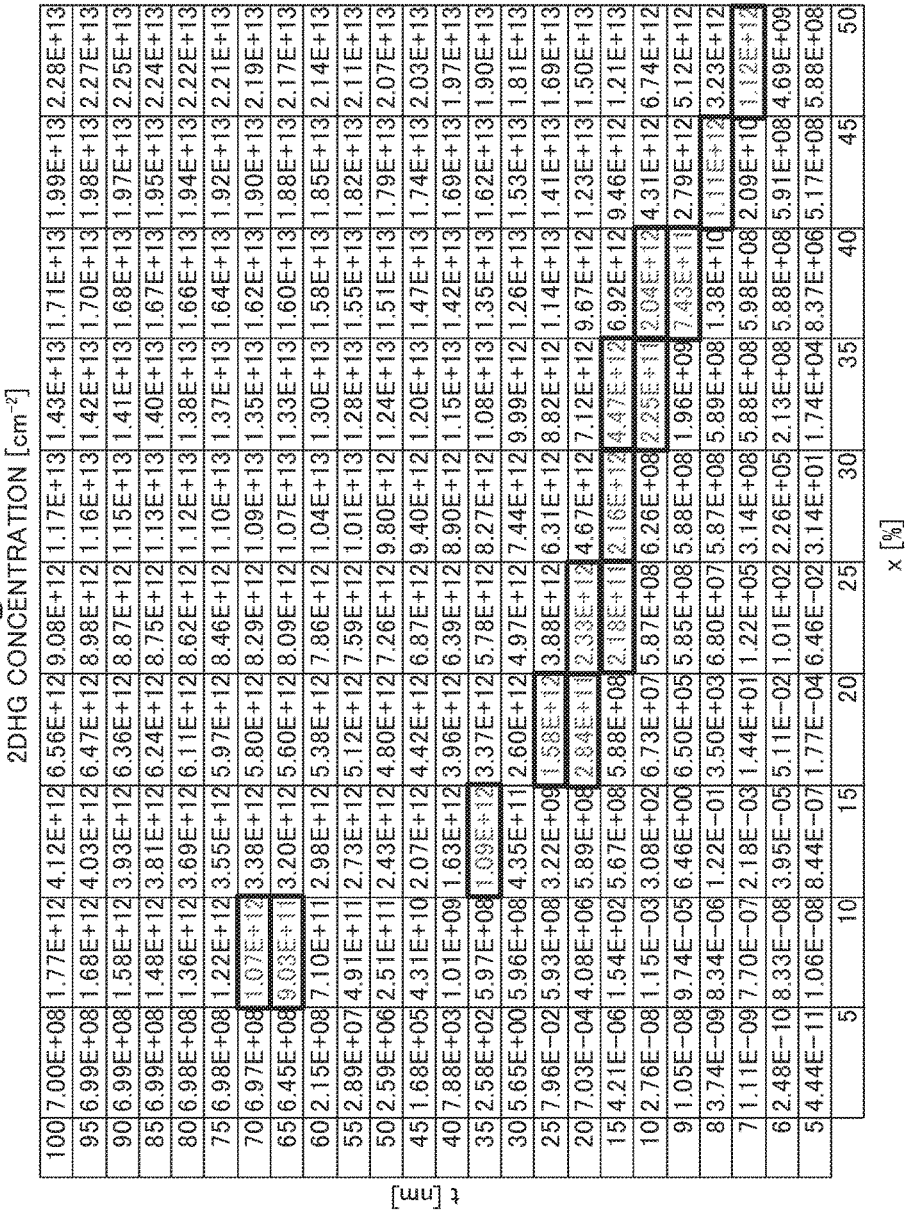

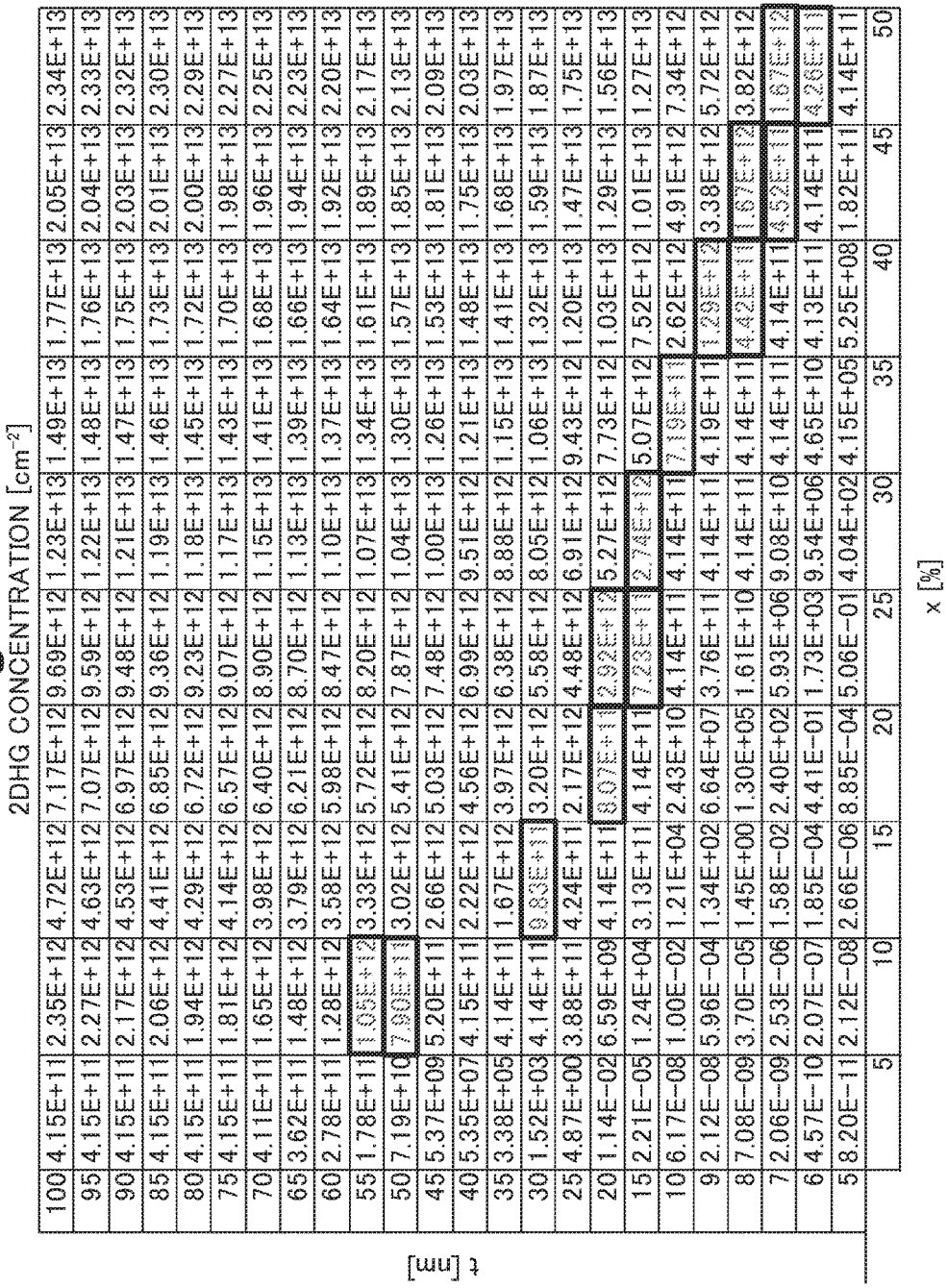

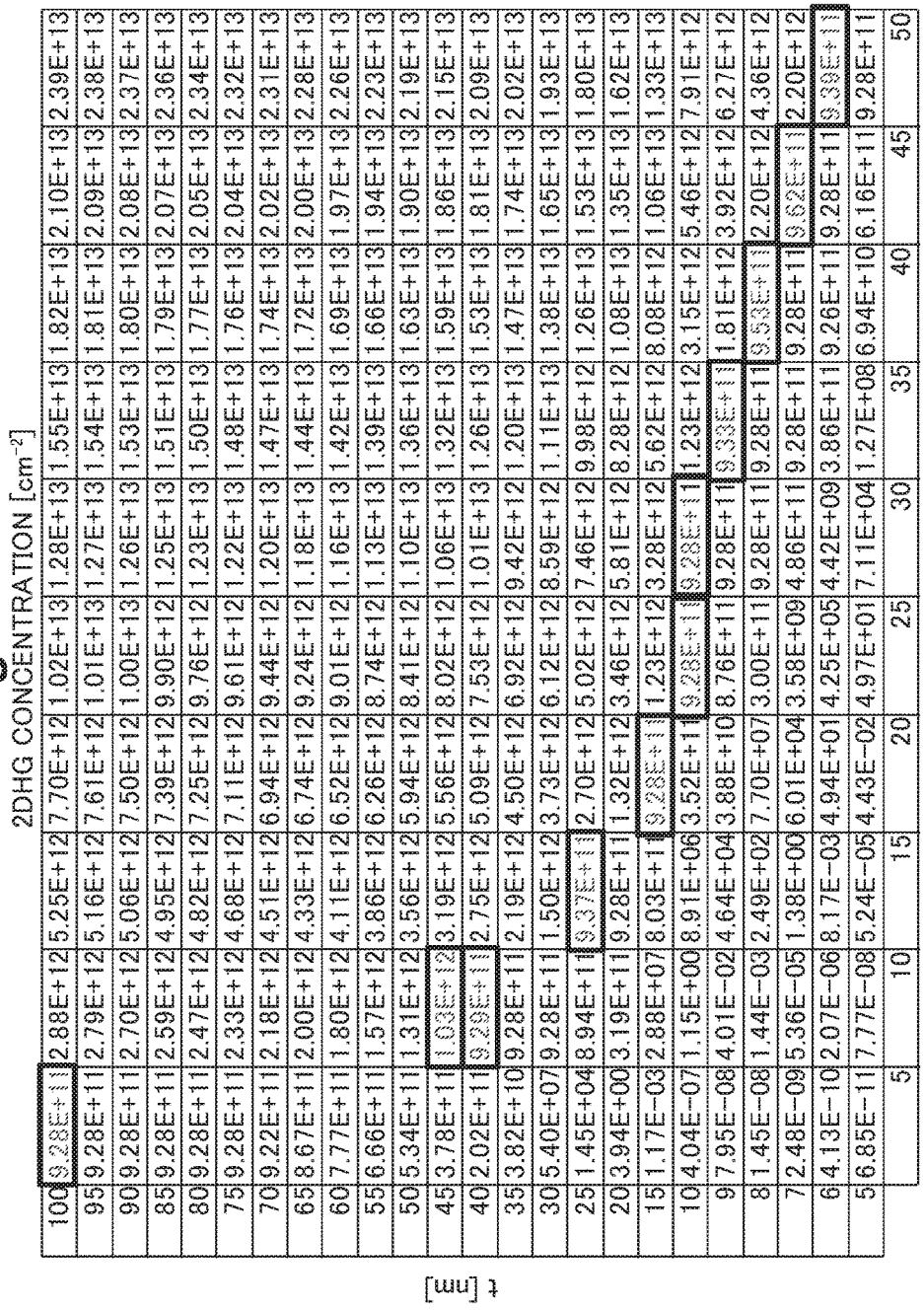

HETERO-JUNCTION BIPOLAR TRANSISTOR AND ELECTRIC DEVICE

CROSS REFERENCES TO RELATED APPLICATIONS

The present application is a national stage of International Application No. PCT/JP2017/003888 filed on Feb. 3, 2017 and claims priority to Japanese Patent Application No. 2016-019441 filed on Feb. 4, 2016, the disclosure of which is incorporated herein by reference.

TECHNICAL FIELD

This invention relates to a hetero-junction bipolar transistor and an electric device, and particularly relates to a hetero-junction bipolar transistor using a gallium nitride (GaN)-based semiconductor and an electric device using the hetero-junction bipolar transistor.

BACKGROUND ART

The hetero-junction bipolar transistor (HBT) is known as a high frequency transistor which can supply a high current. On the other hand, since GaN-based semiconductor is a widegap semiconductor, it is possible to apply a high voltage. Therefore, if a hetero-junction bipolar transistor is made by GaN-based semiconductor, it is expected that a high frequency power transistor having high resistance voltage and high power is realized.

Until now, the following GaN-based hetero-junction bipolar transistor is known (see patent literature 1.). The GaN-based hetero-junction bipolar transistor is made as follows. An AlN buffer layer, a GaN buffer layer, an emitter layer made of n-type AlGaN, a base layer made of p-type GaN, a collector layer made of n-type AlGaN and a subcollector layer made of n-type GaN are grown in order. Then the collector layer and the subcollector layer are patterned into a prescribed shape by etching and further the base layer is patterned into a prescribed shape by etching. Finally, an emitter electrode is formed on a part of the emitter layer where the base layer is removed, a base electrode is formed on a part of the base layer where the collector layer and the subcollector layer are removed and a collector electrode is formed on the subcollector.

PRIOR ART LITERATURE

Patent Literature

[PATENT LITERATURE 1] Laid-Open Patent Gazette 2005-79417

SUMMARY OF INVENTION

Subjects to be Solved by the Invention

However, according to inventor's consideration, it is difficult to perform high frequency power amplification or high frequency power switching of the GaN-based hetero-junction bipolar transistor proposed by patent literature 1.

Therefore, the subject to be solved by the invention is to provide a high performance hetero-junction bipolar transistor which can easily perform high frequency power amplification or high frequency power switching.

Another subject to be solved by the invention is to provide a high performance electric device using the hetero-junction bipolar transistor.

Means to Solve the Subjects

To solve the above subject, according to the invention, there is provided a hetero-junction bipolar transistor, comprising:

a first n-type GaN layer;
an $Al_xGa_{1-x}N$ layer ($0.1 \leq x \leq 0.5$) on the first n-type GaN layer;
an undoped GaN layer having a thickness of not less than 20 nm on the $Al_xGa_{1-x}N$ layer;
a Mg-doped p-type GaN layer having a thickness of not less than 100 nm on the undoped GaN layer;
a second n-type GaN layer on the p-type GaN layer;
an emitter electrode electrically connected to the first n-type GaN layer;
a base electrode electrically connected to the p-type GaN layer; and
a collector electrode electrically connected to the second n-type GaN layer,
an emitter being formed by the first n-type GaN layer and the $Al_xGa_{1-x}N$ layer, a base being formed by the undoped GaN layer and the p-type GaN layer and a collector being formed by the second n-type GaN layer,
two-dimensional hole gas being formed in a part of the undoped GaN layer near the hetero interface between the $Al_xGa_{1-x}N$ layer and the undoped GaN layer during non-operation,
$p \times b \times 10^{-7} + P_s \geq 1 \times 10^{13}$ [cm$^{-2}$] being satisfied where b denotes the thickness of the p-type GaN layer, p denotes the hole concentration of the p-type GaN layer and $P_s$ denotes the concentration of the two-dimensional hole gas.

Here, the non-operation can also be said as a thermal equilibrium state in other words. The two-dimensional hole gas formed in a part of the undoped GaN layer near the hetero interface between the $Al_xGa_{1-x}N$ layer and the undoped GaN layer is formed by negative fixed charge induced in a part of the $Al_xGa_{1-x}N$ layer near the hetero interface between the $Al_xGa_{1-x}N$ layer and the undoped GaN layer by piezopolarization and spontaneous polarization.

Not only holes supplied from Mg (magnesium), i.e., acceptors doped with the p-type GaN layer but also the high concentration two-dimensional hole gas formed in the undoped GaN layer contribute to holes of the base. Therefore, a sufficient hole concentration of the base can be obtained. As described in details later, according to the present inventor's consideration, the hole concentration (sheet concentration) of the base should be not less than $1 \times 10^{13}$ cm$^{-2}$ in order to realize a hetero-junction bipolar transistor capable of operating in high frequency. This condition is $p \times b \times 10^{-7} + P_s \geq 1 \times 10^{13}$ [cm$^{-2}$]. Here, $10^{-7}$ on the left side is a multiplier to convert b in unit of nm into cm. This condition can be satisfied by selection of the concentration of Mg doped with the p-type GaN layer and the concentration $P_s$ of the two-dimensional hole gas formed in the undoped GaN layer. That is, when the concentration of Mg doped with the p-type GaN layer is denoted as $N_{Mg}$ [cm$^{-3}$] and the electrical activation ratio of Mg doped with the p-type GaN layer is denoted as r, this condition can be expressed as $N_{Mg} \times r \times b \times 10^{-7} + P_s \geq 1 \times 10^{13}$ [cm$^{-2}$]. Generally r is about 0.01(1%). If the concentration of Mg doped with the p-type GaN layer is too high, crystal quality of the p-type GaN layer deteriorates, which results in deterioration of characteristics of the hetero-junction bipolar transistor.

Therefore, it is desirable to lower $N_{Mg}$ by increasing $P_s$. For example, when a half of $1\times10^{13}$ cm$^{-2}$, which is the necessary hole concentration of the base, i.e., $5\times10^{12}$ [cm$^{-2}$] is supplied by the two-dimensional hole gas, in other words, when $P_s=5\times10^{12}$ [cm$^{-2}$], it is enough that $N_{Mg}\times r\times b\times10^{-7}\geq5\times10^{12}$ [cm$^{-2}$]. Generally, $5\times10^{19}$ [cm$^{-3}$]$\leq N_{Mg}\leq 9\times10^{19}$ [cm$^{-3}$]. On the other hand, in order to prevent the base from depleting completely and causing punch-through when a reverse bias voltage is applied between base-collector of the hetero-junction bipolar transistor during operation, it is necessary that the thickness of the p-type GaN layer is not less than 100 nm, that is, $b\geq100$ nm. For example, in the case where $b=100$ nm, when $r=0.01=10^{-2}$, $N_{Mg}\geq5\times10^{19}$ [cm$^{-3}$] is enough to satisfy $N_{Mg}\times10^{-2}\times100\times10^{-7}\geq5\times10^{12}$ [cm$^{-2}$].

In order to obtain a high concentration two-dimensional hole gas, the Al composition x and the thickness t [nm] of the $Al_xGa_{1-x}N$ layer are selected so as to satisfy the following equation.

$$t \geq \alpha x^\beta$$

Here, x in the inequality denotes numerals represented in %. For example, when the Al composition x is 0.25, x in the inequality is 25. $\alpha$ and $\beta$ in the inequality are numerals determined depending on necessary two-dimensional hole gas concentration $P_s$ and are determined by calculation as described later. For example, when $P_s\geq5\times10^{12}$ [cm$^{-2}$], $\alpha=11290$ and $\beta=-1.865$. In this case, the above inequality is written as $t\geq 11290 x^{-1.865}$. The Al composition x is typically constant for the whole $Al_xGa_{1-x}N$ layer, but may be changed, for example, in the thickness direction, if necessary. The $Al_xGa_{1-x}N$ layer is typically undoped, but may be the n-type $Al_xGa_{1-x}N$ layer doped with donors (n-type impurities), for example, Si in for example, $1\times10^{16}\sim1\times10^{18}$ cm$^{-3}$, if necessary. Depending on the situation, the $Al_xGa_{1-x}N$ layer may be, for example, the p-type $Al_xGa_{1-x}N$ layer doped with Mg in extremely low concentration, which is almost the i-type $Al_xGa_{1-x}N$ layer.

Typically, the first n-type GaN layer is formed on a first n$^+$-type GaN layer, the second n-type GaN layer is formed on the p-type GaN layer like a mesa and a second n$^+$-type GaN layer is formed on the second n-type GaN layer. Typically, the emitter electrode is formed on the surface of the first n$^+$-type GaN layer opposite to the first n-type GaN layer, the base electrode is formed on a part of the p-type GaN layer on which no second n-type GaN layer is formed and the collector electrode is formed on the second n$^+$-type GaN layer. The first n$^+$-type GaN layer is an ohmic contact layer and its donor concentration is selected to be sufficiently high so that the emitter electrode can make ohmic contact. Acceptor concentration of the p-type GaN layer is selected sufficiently high so that the base electrode can make ohmic contact. Donor concentration of the second n$^+$-type GaN layer is selected to be sufficiently high so that the collector electrode can make ohmic contact.

If necessary, formed between the $Al_xGa_{1-x}N$ layer and the undoped GaN layer an $Al_yGa_{1-y}N$ graded layer in which the Al composition y decreases monotonically from x to 0 in the direction from the $Al_xGa_{1-x}N$ layer to the undoped GaN layer. In this case, the $Al_yGa_{1-y}N$ graded layer also forms the emitter. The $Al_yGa_{1-y}N$ graded layer is preferably undoped, but may be the n-type $Al_xGa_{1-x}N$ layer doped with donors (n-type impurities), for example, Si in $1\times10^{16}\sim1\times10^{18}$ cm$^{-3}$, if necessary. With the $Al_yGa_{1-y}N$ graded layer formed between the $Al_xGa_{1-x}N$ layer and the undoped GaN layer, discontinuity of the conduction band and the valence band in the hetero interface between the $Al_xGa_{1-x}N$ layer and the undoped GaN layer can be canceled. Therefore, it is possible to increase the collector current of the hetero-junction bipolar transistor and it is possible to cancel offset of the emitter-collector voltage from which the collector current begins to flow in output characteristics. The Al composition y of the $Al_yGa_{1-y}N$ graded layer may monotonically decrease from x to 0 linearly or like a curve. If necessary, the hetero-junction bipolar transistor further comprises a p-type GaN layer formed between the second n-type GaN layer and the second n$^+$-type GaN layer. With the p-type GaN layer formed between the second n-type GaN layer and the second n$^+$-type GaN layer, the inclination of the energy band of the second n-type GaN layer during operation of the hetero-junction bipolar transistor is decreased, and therefore the electric field applied to the second n-type GaN layer can be relaxed. Therefore, it is possible to suppress intervalley scattering and optical phonon scattering in the second n-type GaN layer and it is possible to make the hetero-junction bipolar transistor fast.

In the hetero-junction bipolar transistor, if necessary, interlayers having any function may be formed between each of the layers as far as the characteristics of the hetero-junction bipolar transistor are not spoiled.

According to the invention, there is further provided an electric device, comprising:

at least a semiconductor element, the semiconductor element being a hetero-junction bipolar transistor, comprising:

a first n-type GaN layer;

an $Al_xGa_{1-x}N$ layer ($0.1\leq x\leq 0.5$) on the first n-type GaN layer;

an undoped GaN layer having a thickness of not less than 20 nm on the $Al_xGa_{1-x}N$ layer;

a Mg-doped p-type GaN layer having a thickness of not less than 100 nm on the undoped GaN layer;

a second n-type GaN layer on the p-type GaN layer;

an emitter electrode electrically connected to the first n-type GaN layer;

a base electrode electrically connected to the p-type GaN layer; and a collector electrode electrically connected to the second n-type GaN layer, an emitter being formed by the first n-type GaN layer and the $Al_xGa_{1-x}N$ layer, a base being formed by the undoped GaN layer and the p-type GaN layer and a collector being formed by the second n-type GaN layer, two-dimensional hole gas being formed in a part of the undoped GaN layer near the hetero interface between the $Al_xGa_{1-x}N$ layer and the undoped GaN layer during non-operation, $p\times b\times10^{-7}+P_s\geq1\times10^{13}$ [cm$^{-2}$] being satisfied where b denotes the thickness of the p-type GaN layer, p denotes the hole concentration of the p-type GaN layer and $P_s$ denotes the concentration of the two-dimensional hole gas.

Here, the electric device includes all devices using electricity and their uses, functions, sizes, etc. are not limited and they are, for example, electronic devices, mobile bodies, power plant, construction machinery, machine tools, etc. The electronic devices are, for example, communication equipments, robots, computers, game devices, car devices, home electric products (air conditioner etc.), industrial products, mobile phones, mobile devices, IT devices (server etc.), power conditioners used in solar power generation systems, power supplying systems, etc. The mobile bodies are railroad cars, motor vehicles (electric car etc.), motor cycles, aircrafts, rockets, spaceships, etc. Especially, the electronic devices include high power amplifiers used in a base station of the next generation mobile communication system, air traffic control radars, millimeter wave transillumination examination apparatuses, wireless power transmitters, particle accelerators, etc.

In the invention of the electric device, the explanation concerning the above invention of the hetero-junction bipolar transistor comes into effect unless it is contrary to its character.

Effect of the Invention

According to the invention, the hole concentration of the base is not less than $1\times10^{13}$ [cm$^{-2}$], that is high enough, and the thickness of the p-type GaN layer forming the base is not less than 100 nm. Therefore, when a voltage of not less than 100V is applied between the base and the collector during operation, it is possible to effectively prevent punch-through occurring on the base side between the base and the collector and to lower the base resistance sufficiently, thereby making it possible to improve the current amplification ratio of the hetero-junction bipolar transistor. Furthermore, since a part of the hole concentration of the base can be supplied from the high concentration two-dimensional hole gas, it is not necessary to increase the concentration of Mg doped with the p-type GaN layer too much and therefore the crystal quality of the p-type GaN layer can be improved, thereby making it possible to improve the characteristics of the hetero-junction bipolar transistor. Since the undoped GaN layer having a thickness of not less than 20 nm formed between the Al$_x$Ga$_{1-x}$N layer and the p-type GaN layer doped with Mg serves as the diffusion barrier layer of Mg, it is possible to effectively prevent Mg of the p-type GaN layer from diffusing into the Al$_x$Ga$_{1-x}$N layer. With this, it is possible to prevent the p-n junction interface between the emitter and the base from locating in the Al$_x$Ga$_{1-x}$N layer, thereby making it possible to decrease the base reactive current. Since it is possible to easily obtain a collector up structure in which the collector lies on the upper side, it is possible to decrease the collector capacitance substantially, thereby making it possible to make the hetero-junction bipolar transistor fast. Accordingly, it is possible to realize a high performance hetero-junction bipolar transistor which can perform high frequency power amplification or high frequency power switching easily. And a high performance electric device can be realized by using the hetero-junction bipolar transistor.

BRIEF DESCRIPTION OF THE DRAWINGS

FIG. 17 An energy band diagram of the polarization super junction obtained by simulation performed based on the one-dimensional model along the stacking direction of the undoped GaN layer 52/the Al$_x$Ga$_{1-x}$N layer 53/the undoped GaN layer 54 of the Hall measurement sample shown in FIG. 15.

FIG. 18 A schematic view showing profiles of the 2DHG concentration and the 2DEG concentration of the polarization super junction obtained by simulation.

FIG. 19 A schematic view showing the calculated values and the measurement values for the remaining thickness of the undoped GaN layer 54.

FIG. 20 A schematic view showing the calculation result of the 2DHG concentration where the remaining thickness of the undoped GaN layer 54 is 10 nm.

FIG. 21 A schematic view showing the calculation result of the 2DHG concentration where the remaining thickness of the undoped GaN layer 54 is 50 nm.

FIG. 22 A schematic view showing the calculation result of the 2DHG concentration where the remaining thickness of the undoped GaN layer 54 is 100 nm.

FIG. 23 A schematic view showing the calculation result of the 2DHG concentration where the remaining thickness of the undoped GaN layer 54 is 1000 nm.

MODES FOR CARRYING OUT THE INVENTION

Modes for carrying out the invention (hereinafter referred as "embodiments") will now be explained below.

1. The First Embodiment

[GaN-Based HBT]

The GaN-based HBT according to the first embodiment is described. The base structure of the GaN-based HBT is shown in FIG. 1.

Figure 1:
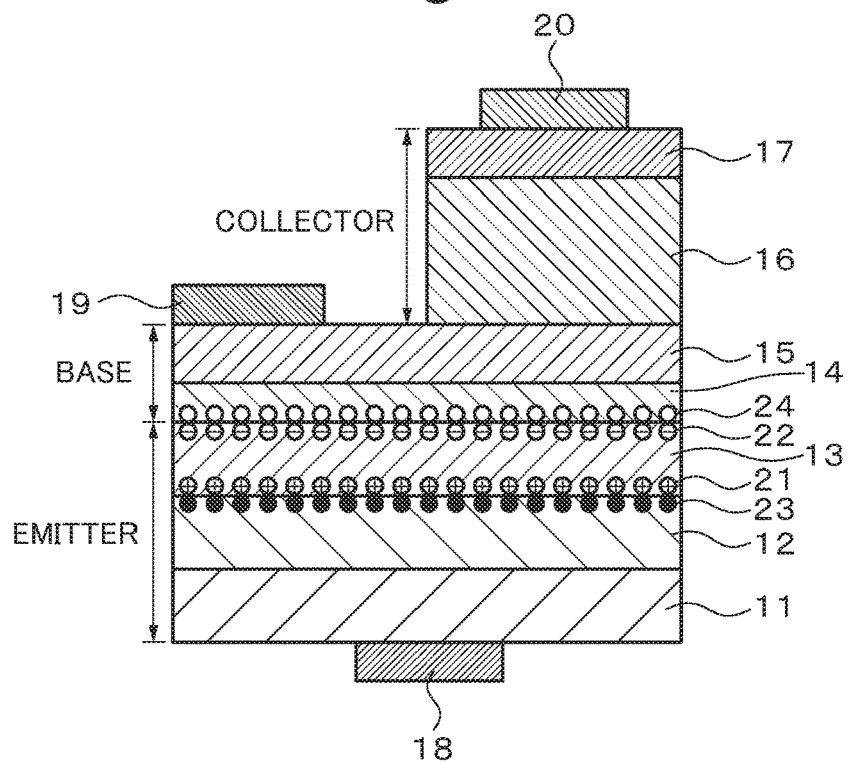
FIG. 1 A cross-sectional view showing the base structure of the GaN-based HBT according to a first embodiment of the invention.

As shown in FIG. 1, in the GaN-based HBT, stacked in order are an $n^+$-type GaN layer 11, an n-type GaN layer 12, an undoped $Al_xGa_{1-x}N$ layer 13, an undoped GaN layer 14, a p-type GaN layer 15, an n-type GaN layer 16 and an $n^+$-type GaN layer 17. The $n^+$-type GaN layer 11 may be formed by a grown layer or may be formed by a GaN substrate used for crystal growth. The $n^+$-type GaN layer 11, the n-type GaN layer 12, the undoped $Al_xGa_{1-x}N$ layer 13, the undoped GaN layer 14, the p-type GaN layer 15, the n-type GaN layer 16 and the $n^+$-type GaN layer 17 have typically (0001) plane orientation (C-plane orientation) and the stacking direction is [0001] direction, but not limited to this. The n-type GaN layer 16 and the $n^+$-type GaN layer 17 are selectively formed on the p-type GaN layer 15 and have a mesa shape. The n-type GaN layer 16 and the $n^+$-type GaN layer 17 have, for example, a stripe shape which elongates in one direction. The elongation direction of the n-type GaN layer 16 and the $n^+$-type GaN layer 17 having the stripe shape is typically [10-10] direction, but not limited to this. Donors (n-type impurities) doped with the $n^+$-type GaN layer 11, the n-type GaN layer 12, the n-type GaN layer 16 and the $n^+$-type GaN layer 17 are, for example, Si. Mg is doped with the p-type GaN layer 15 as acceptors (p-type impurities). The Al composition x of the undoped $Al_xGa_{1-x}N$ layer 13 is not less than 0.1 and not larger than 0.5 (not less than 10% and not larger than 50%). The undoped GaN layer 14 has a thickness of not less than 20 nm, preferably not less than 30 nm and serves as the diffusion barrier layer for preventing Mg doped with the p-type GaN layer 15 from diffusing into the undoped $Al_xGa_{1-x}N$ layer 13. The thickness of the undoped GaN layer 14 is preferably not larger than 1000 nm and is generally selected to be not larger than 100 nm. The thickness of the p-type GaN layer 15 is selected, taking the voltage resistance characteristics demanded for the GaN-based HBT into consideration and at least not less than 100 nm or not less than 190 nm, and generally not larger than 800 nm. An emitter electrode 18 is formed on the surface of the $n^+$-type GaN layer 11 opposite to the n-type GaN layer 12, i.e., the back side of the $n^+$-type GaN layer 11 such that it comes in ohmic contact with the $n^+$-type GaN layer 11. The emitter electrode 18 may be formed on a part of the back side of the $n^+$-type GaN layer 11 or may be formed on the whole back side thereof. In FIG. 1, the emitter electrode 18 is formed on a part of the back side of the $n^+$-type GaN layer 11. A base electrode 19 is formed on a part of the p-type GaN layer 15 on which the n-type GaN layer 16 and the $n^+$-type GaN layer 17 are not formed such that it comes in ohmic contact with the p-type GaN layer 15. A collector electrode 20 is formed on the $n^+$-type GaN layer 17 such that it comes in ohmic contact with the $n^+$-type GaN layer 17. The collector electrode 20 may be formed on a part of the surface of the $n^+$-type GaN layer 17 or may be formed on the whole surface of the $n^+$-type GaN layer 17. In FIG. 1, the collector electrode 20 is formed on a part of the surface of the $n^+$-type GaN layer 17. The base electrode 19 and the collector electrode 20 typically have a stripe shape which elongates in the same direction as the n-type GaN layer 16 and the $n^+$-type GaN layer 17 having a stripe shape. In this case, the emitter is formed by the $n^+$-type GaN layer 11, the n-type GaN layer 12 and the undoped $Al_xGa_{1-x}N$ layer 13, the base is formed by the undoped GaN layer 14 and the p-type GaN layer 15 and the collector is formed by the n-type GaN layer 16 and the $n^+$-type GaN layer 17. The npn type GaN-based HBT is formed by the emitter, the base and the collector. The $n^+$-type GaN layer 11 may be called a subemitter and the $n^+$-type GaN layer 17 may be called a subcollector.

In the GaN-based HBT, during non-operation (thermal equilibrium state), positive charges 21 are induced in a part of the undoped $Al_xGa_{1-x}N$ layer 13 near the hetero interface between the undoped $Al_xGa_{1-x}N$ layer 13 and the n-type GaN layer 11 and negative charges 22 are induced in a part of the $Al_xGa_{1-x}N$ layer 13 near the hetero interface between the undoped $Al_xGa_{1-x}N$ layer 13 and the undoped GaN layer 14 by piezopolarization and spontaneous polarization. Therefore, in the GaN-based HBT, during non-operation, two-dimensional electron gas (2DEG) 23 is formed in a part of the n-type GaN layer 12 near the hetero interface between the undoped $Al_xGa_{1-x}N$ layer 13 and the n-type GaN layer 12 and two-dimensional hole gas (2DHG) 24 is formed in a part of the undoped GaN layer 14 near the hetero interface between the undoped $Al_xGa_{1-x}N$ layer 13 and the undoped GaN layer 14.

In the GaN-based HBT, when the thickness of the p-type GaN layer 15 is denoted as b [nm], the hole concentration of the p-type GaN layer 15 is denoted as p [$cm^{-3}$] and the concentration of the two-dimensional hole gas 24 is denoted as $P_s$ [$cm^{-2}$], the condition of $p \times b \times 10^{-7} + P_s \geq 1 \times 10^{13}$ [$cm^{-2}$] is satisfied. When the concentration of Mg doped with the p-type GaN layer 15 is denoted as $N_{Mg}$ [$cm^{-3}$], the electrical activation ratio of Mg doped with the p-type GaN layer 15 is denoted as r, the condition can be expressed as $N_{Mg} \times r \times b \times 10^{-7} + P_s \geq 1 \times 10^{13}$ [$cm^{-2}$]. For $r = 10^{-2}$, the condition is expressed as $N_{Mg} \times 10^{-2} \times b \times 10^{-7} + P_s \geq 1 \times 10^{13}$ [$cm^{-2}$]. As described later, b is selected as $b \geq 100$ [nm] in order to prevent the base from completely depleting and causing punch-through on the base side when the reverse bias voltage is applied between the base and the emitter during operation of the GaN-based HBT.

In the GaN-based HBT, the Al composition x and the thickness t [nm] of the undoped $Al_xGa_{1-x}N$ layer 13 are selected so as to satisfy the following inequality, where numerals represented in % are used as x. For example, when x=0.25, 25 is used as x in the following inequality.

$$t \geq \alpha x^\beta$$

Here, $\alpha$ and $\beta$ are determined depending on the concentration of the 2DHG 24 to be obtained and obtained by calculation as described later. For example, in order to obtain the concentration $P_s$ of the 2DHG 24 of $5\times10^{12}$ cm$^{-2}$, $\alpha$=11290 and $\beta$=−1.865.

Figure 2:
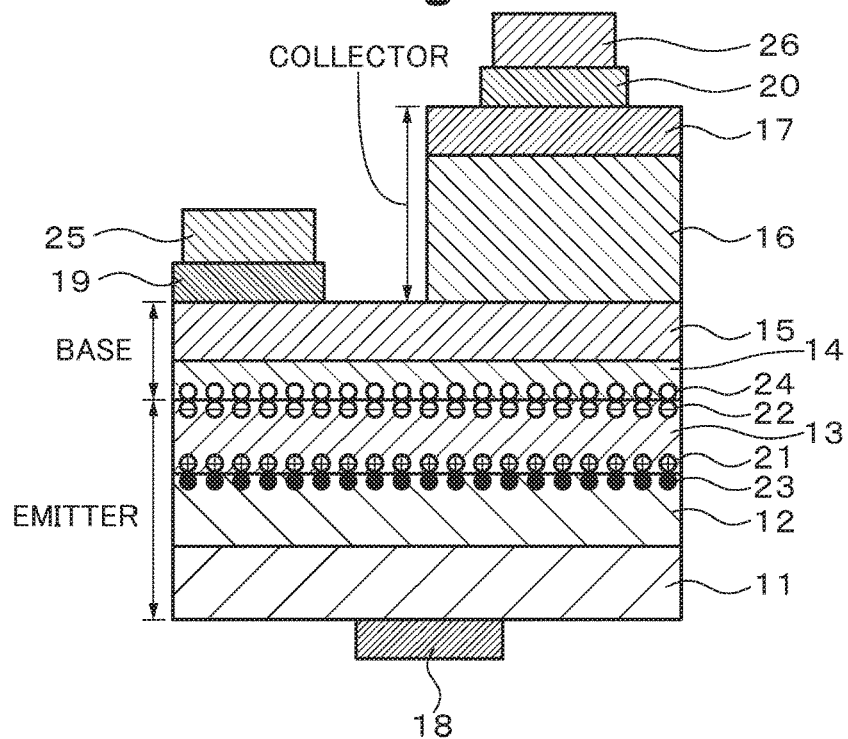
FIG. 2 A cross-sectional view showing a state in which a base pad electrode and a collector pad electrode are formed in the GaN-based HBT according to the first embodiment of the invention.
Figure 3:
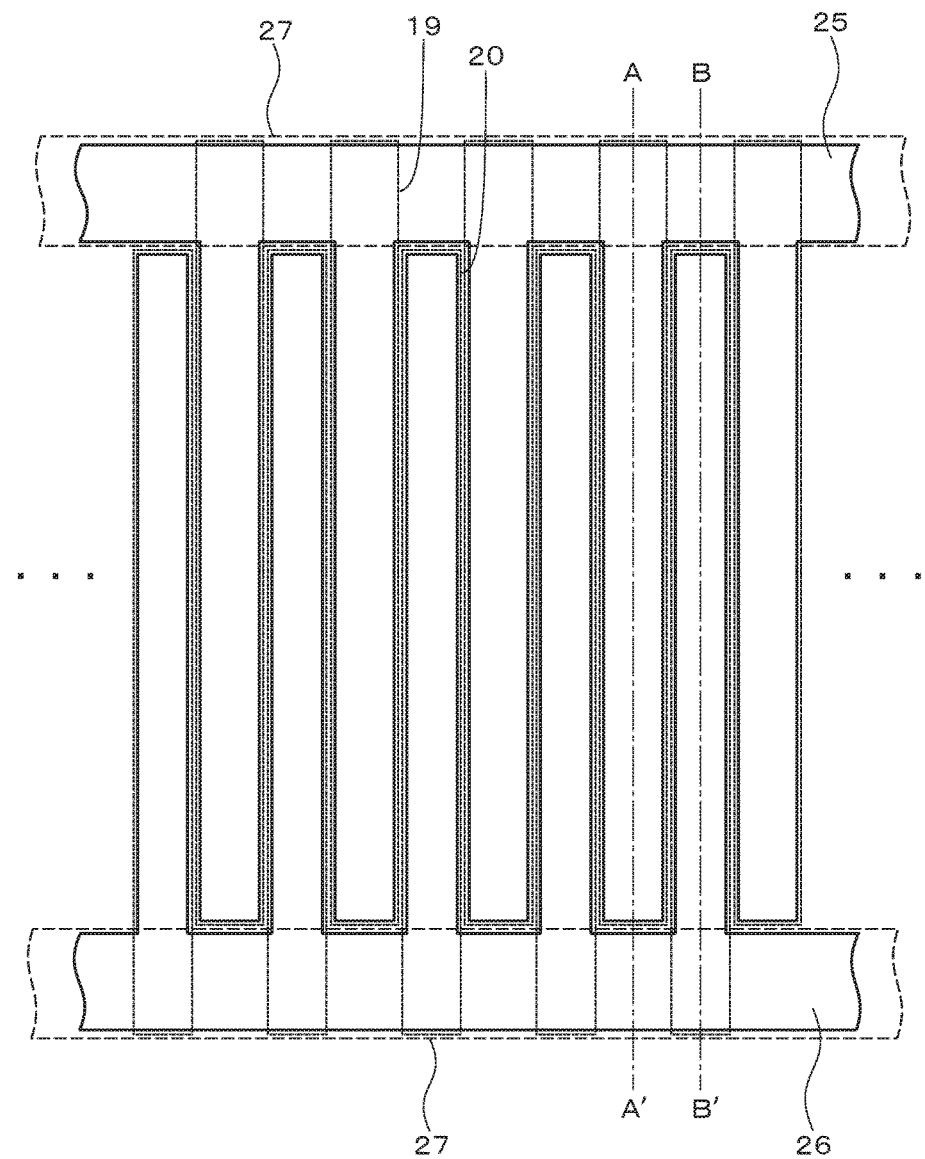
FIG. 3 A plan view showing an example of the planar shape of the base pad electrode and the collector pad electrode shown in FIG. 2.
Figure 4:
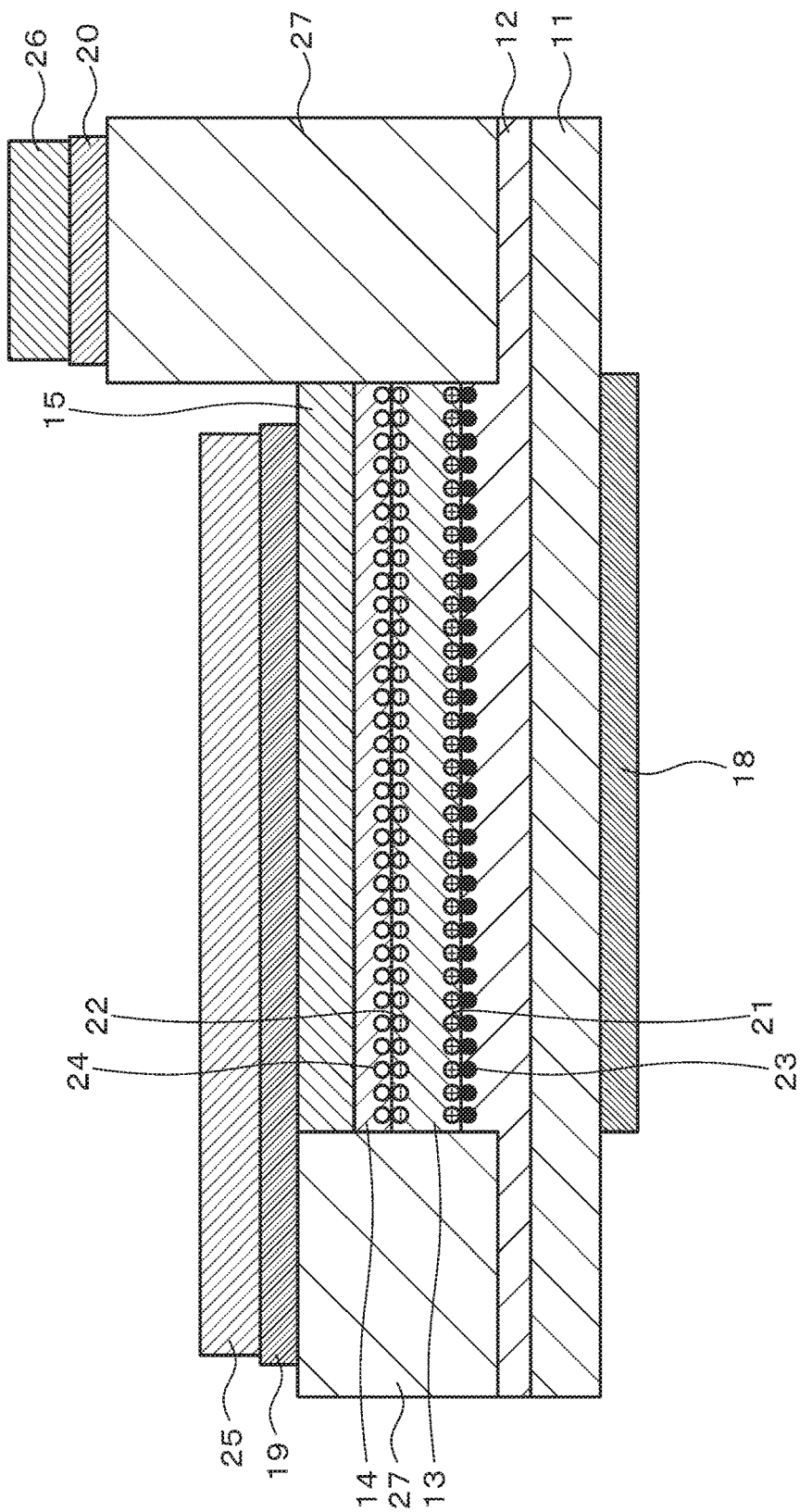
FIG. 4 A cross-sectional view along the A-A' line of FIG. 3.
Figure 5:
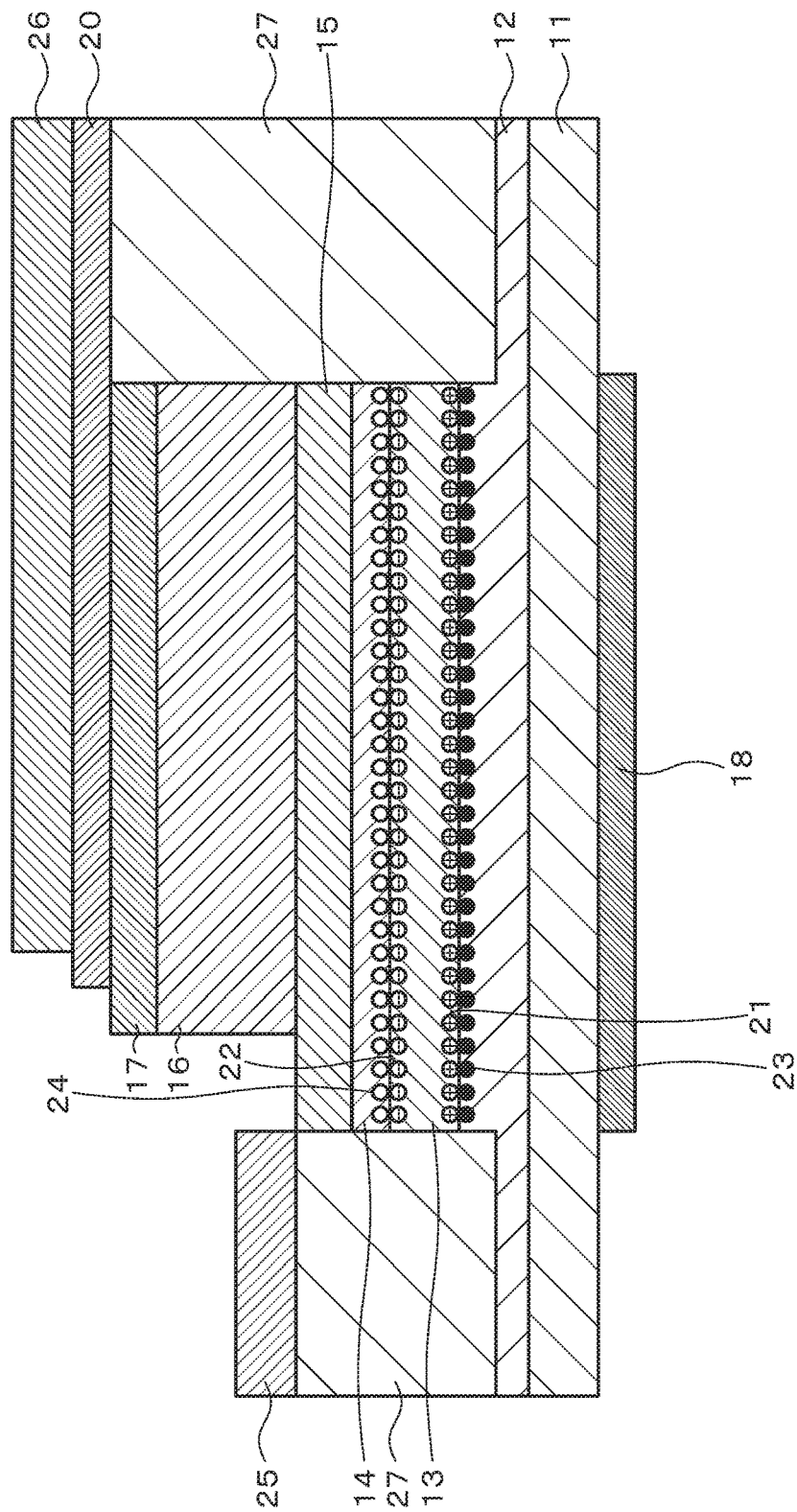
FIG. 5 A cross-sectional view along the B-B' line of FIG. 3.

Typically, a plurality of the n-type GaN layers 16 and the n$^+$-type GaN layers 17 having a stripe shape are formed parallel to each other. The collector electrode 20 is formed on each n$^+$-type GaN layer 17 and the base electrode 19 is formed on the p-type GaN layer 15 between a pair of the collector electrode 20 adjacent to each other. The base electrode 19 and the collector electrode 20 typically have a stripe shape and are formed parallel to each other. As shown in FIG. 2, a base pad electrode 25 and a collector pad electrode 26 are formed so as to come in contact with the base electrode 19 and the collector electrode 20, respectively. An example of the planar shape of the base pad electrode 25 and the collector pad electrode 26 is shown in FIG. 3. FIG. 4 and FIG. 5 show cross-sectional views along the A-A' line and the B-B' line of FIG. 3, respectively. As shown in FIG. 3, in this example, the base pad electrode 25 and the collector pad electrode 26 have a comb like shape and parts of the base pad electrode 25 and the collector pad electrode 26 corresponding to teeth of the comb are formed on the base electrode 19 and the collector electrode 20 so as to come in contact with the base electrode 19 and the collector electrode 20, respectively. As shown in FIG. 4 and FIG. 5, a high resistance layer 27, which serves as electrical insulator substantially, is formed below parts of the base pad electrode 25 and the collector pad electrode 26 other than the parts corresponding to the teeth of the comb. The high resistance layer 27 is made of, for example, insulating film such as $SiO_2$ film and $Si_3N_4$ film and ion-implanted layer with implanted boron (B) etc.

The thicknesses of the n$^+$-type GaN layer 11, the n-type GaN layer 12, the undoped $Al_xGa_{1-x}N$ layer 13, the undoped GaN layer 14, the p-type GaN-layer 15, the n-type GaN layer 16 and the n$^+$-type GaN layer 17 are suitably selected. For example, the thicknesses are 1~10 μm for the n$^+$-type GaN layer 11, 0.2~1 μm for the n-type GaN layer 12, 20~200 nm for the undoped $Al_xGa_{1-x}N$ layer 13, 20~100 nm, more generally 20~50 nm for the undoped GaN layer 14 as described before, 0.1~0.9 μm for the p-type GaN layer 15, 0.5~5 μm for the n-type GaN layer 16 and 0.05~0.5 μm for the n$^+$-type GaN layer 17. Donor concentrations of the n$^+$-type GaN layer 11, the n-type GaN layer 12, the n-type GaN layer 16 and the n$^+$-type GaN layer 17 are suitably selected. For example, donor concentrations are $1\times10^{18}$ $1\times10^{19}$ cm$^{-3}$ for the n$^+$-type GaN layer 11, (0.5~2)$\times10^{18}$ cm$^{-3}$ for the n-type GaN layer 12, (0.5~5)$\times10^{16}$ cm$^{-3}$ for the n-type GaN layer 16 and (1~10)$\times10^{18}$ cm$^{-3}$ for the n$^+$-type GaN layer 17. The Mg concentration $N_{Mg}$ (acceptor concentration $N_A$) [cm$^{-3}$] of the p-type GaN layer 15 is generally (1~9)$\times10^{19}$ cm$^{-3}$. The Al composition x of the undoped $Al_xGa_{1-x}N$ layer 13 is suitably selected and, for example, 0.1~0.4. At least the lowest layer of the emitter electrode 18 and the collector electrode 20 are made of metal which can come in ohmic contact with a n-type GaN, for example, Ti. For example, the emitter electrode 18 and the collector electrode 20 are formed by a Ti/Al/Au stacked film. At least the lowest layer of the base electrode 10 is made of metal which can come in ohmic contact with a p-type GaN, for example, Ni. For example, the base electrode 19 is formed by a Ni/Al stacked film.

A specific example of the structure of the GaN-based HBT is described. The n$^+$-type GaN layer 11 is a thinned n-type GaN substrate. The thickness and the donor concentration of the n-type GaN layer 11 are 0.5 μm and $1\times10^{18}$ cm$^{-3}$, respectively. The thickness and the Al composition x of the undoped $Al_xGa_{1-x}N$ layer 13 are 45 nm and 0.25, respectively. The thickness of the undoped GaN layer 14 is 20 nm. The thickness and the acceptor concentration of the p-type GaN layer 15 are 0.5 μm and $5\times10^{19}$ cm$^{-3}$ (hole concentration ~$5\times10^{17}$ cm$^{-3}$), respectively. The thickness and the donor concentration of the n-type GaN layer 16 are 1.0 μm and $1\times10^{16}$ cm$^{-3}$, respectively. The thickness and the donor concentration of the n$^+$-type GaN layer 17 are 0.1 μm and $5\times10^{18}$ cm$^{-3}$, respectively. The emitter electrode 18 and the collector electrode 20 are formed by a Ti/Al/Au stacked film. The base electrode 19 is formed by a Ni/Al stacked film.

Figure 6:
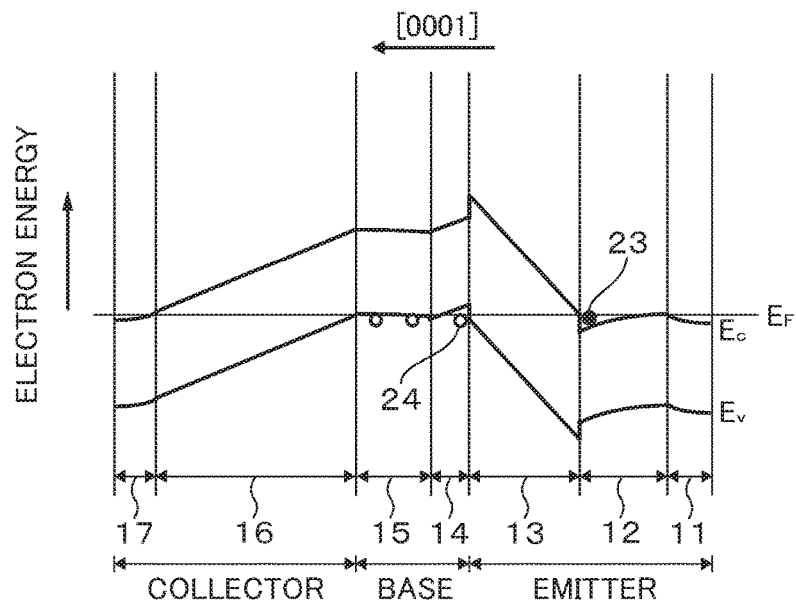
FIG. 6 A schematic view showing the energy band of the GaN-based HBT according to the first embodiment of the invention during non-operation.

FIG. 6 shows an energy band structure of the GaN-based HBT during non-operation. In FIG. 6, $E_c$ denotes an energy of the bottom of the conduction band, $E_v$ denotes an energy of the top of the conduction band and $F_F$ denotes the Femi energy. As shown in FIG. 6, a DEG23 is formed in a part of the n-type GaN layer 12 near the hetero interface between the undoped $Al_xGa_{1-x}N$ layer 13 and the n-type GaN layer 12 and a 2DHG 24 is formed in a part of the undoped GaN layer 14 near the hetero interface between the undoped $Al_xGa_{1-x}N$ layer 13 and the undoped GaN layer 14.

[Operation of the GaN-Based HBT]

Voltage applied to the GaN-based HBT during operation is basically as the same as general npn type bipolar transistors.

Figure 7:
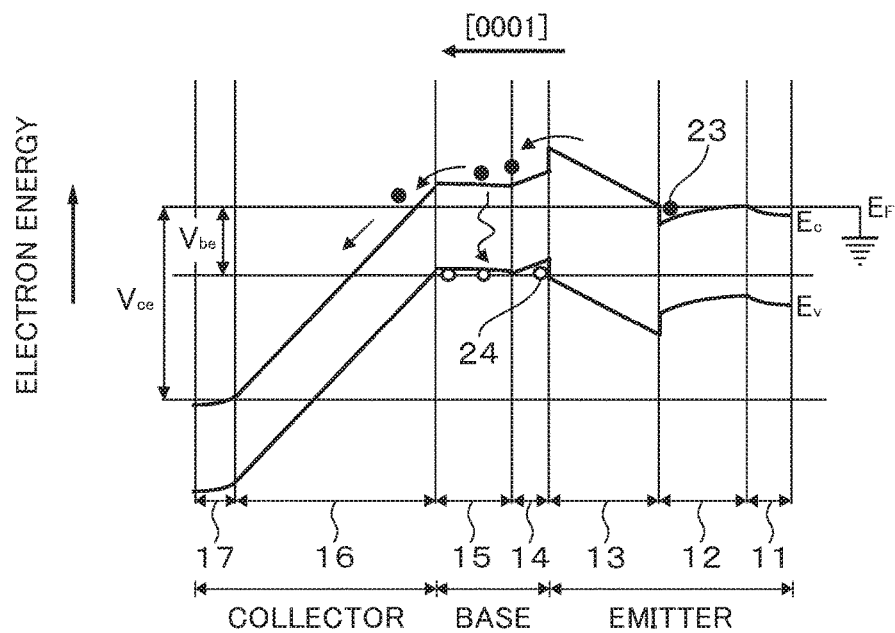
FIG. 7 A schematic view showing the energy band of the GaN-based HBT according to the first embodiment of the invention during operation.

That is, the p-n junction between the emitter and the base is forward biased and the p-n junction between the base and the collector is reverse biased. FIG. 7 shows an energy band structure of the GaN-based HBT when the voltage $V_{be}$ is applied between the base and the emitter and the voltage $V_{ce}$ is applied between the collector and the emitter during operation. With application of the voltage $V_{be}$ the p-n junction between the base and the emitter is forward biased and electrons are injected into the undoped GaN layer 14 and the p-type GaN layer 15 which forms the base from the n-type GaN layer 12 which forms the emitter. The injected electrons flow in the base and reach the p-n junction between the base and the collector which is reverse biased and finally flows to the collector through the p-n junction. In the p-type GaN layer 15 which forms the base, a part of electrons injected from the n-type GaN layer 12 which forms the emitter recombine with holes to disappear.

[Method for Making the GaN-Based HBT]

Figure 8:
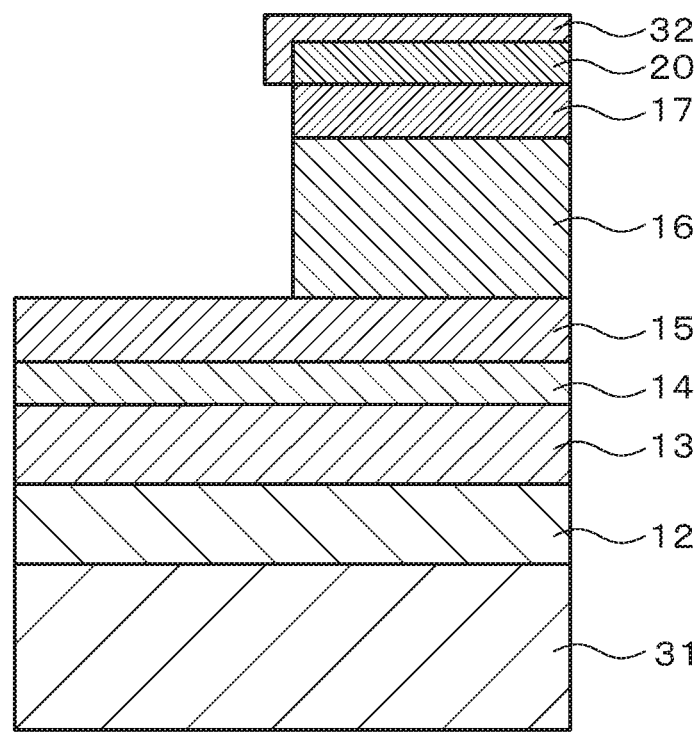
FIG. 8 A schematic view showing a method for making the GaN-based HBT according to the first embodiment of the invention.

First, as shown in FIG. 8, the n-type GaN layer 12, the undoped $Al_xGa_{1-x}N$ layer 13, the undoped GaN layer 14, the p-type GaN layer 15, the n-type GaN layer 16 and the n$^+$-type GaN layer 17 are grown in order on, for example, an n-type GaN substrate 31 having (0001) plane (C-plane) orientation with the conventionally known MOCVD (metal organic chemical vapor deposition) method. The n-type GaN substrate 31 has the donor concentration corresponding to the n$^+$-type GaN layer 11. For example, TMG (trimethyl gallium) is used as Ga source, TMA (trimethyl aluminum) is used as Al source, $NH_3$ (ammonia) is used as nitrogen source and $N_2$ gas and $H_2$ gas are used as a carrier gas. The growth temperature is, for example, about 1100° C.

Then, although not illustrated, an insulating film such as a $SiO_2$ film and a SiN film is formed on the whole surface of the $n^+$-type GaN layer 17. Thereafter, a resist pattern having a prescribed shape is formed on the insulating film and the insulating film is etched and patterned into a prescribed shape by using the resist pattern as a mask. Then, for example, boron (B) is ion-implanted into the depth reaching the n-type GaN layer 12 in the prescribed condition by using the insulating film as a mask. The resistance of the B-implanted region becomes high and therefore a high resistance layer 27 is formed in the prescribed part of the n-type GaN layer 12, the undoped $Al_xGa_{1-x}N$ layer 13, the undoped GaN layer 14, the p-type GaN layer 15, the n-type GaN layer 16 and the $n^+$-type GaN layer 17.

Figure 9:
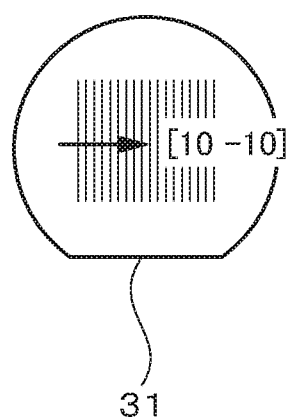
FIG. 9 A schematic view showing a method for making the GaN-based HBT according to the first embodiment of the invention.

Then the collector electrode 20 having a stripe shape is formed on the $n^+$-type GaN layer 17. More specifically, for example, a metal film for forming a collector electrode is formed on the whole surface of the $n^+$-type GaN layer 17 by vacuum evaporation method etc., a resist pattern having a stripe shape is formed on the metal film and the metal film is etched and patterned by using the resist patter as a mask. In this way, the collector electrode 20 having a stripe shape is formed. Thereafter, the resist pattern is removed. Then, the $n^+$-type GaN layer 17 and the n-type GaN layer 16 are etched in order by using the collector electrode 20 as a mask to expose the p-type GaN layer 15. This etching is performed by, for example, a reactive ion etching (RIE) using a chlorine-based etching gas. If necessary, an etching stop layer or an etching monitoring layer is formed between the p-type GaN layer 15 and the n-type GaN layer 16 in order to make it possible to automatically stop etching and therefore to stop etching of the p-type GaN layer 15 when the $n^+$-type GaN layer 17 and the n-type GaN layer 16 are completely etched. As a result, the $n^+$-type GaN layer 17 and the n-type GaN layer 16 are patterned into a stripe shape as the same as the collector electrode 20. Plural patterns of the collector electrode 20, the $n^+$-type GaN layer 17 and the n-type GaN layer 16 having the stripe shape are formed in the [10-10] direction parallel to each other (see FIG. 9). Then, a $SiO_2$ film is formed on the whole surface by, for example, vacuum evaporation method. Thereafter, a resist pattern having a prescribed shape, which has an opening in a part corresponding to the base electrode 19, is formed on the $SiO_2$ film and the $SiO_2$ film is etched by, for example, an inductively coupled plasma (ICP) gas etching method by using the resist pattern as a mask. As a result, only the $SiO_2$ film 32 which covers the collector electrode 20 is left. Then, side walls of the n-type GaN layer 16 and the $n^+$-type GaN layer 17 having a stripe shape are selectively etched by wet etching in order to remove etching damage caused to the sidewalls of the n-type GaN layer 16 and the $n^+$-type GaN layer 17 and to secure the flatness of the sidewalls. Here, a mixed solution of KOH and TMAH (Tetra-methyl-ammonium acid) is used as an etching solution. Then, a heat treatment is performed to improve the ohmic contact characteristics of the collector electrode 20 for the $n^+$-type GaN layer 17 and to electrically activate Mg doped with the p-type GaN layer 15. When the collector electrode 20 is formed by a Ti/Al/Au stacked film, the heat treatment is performed, for example, in a nitrogen gas ($N_2$) in a condition of 750° C. and 5 minutes.

Figure 10:
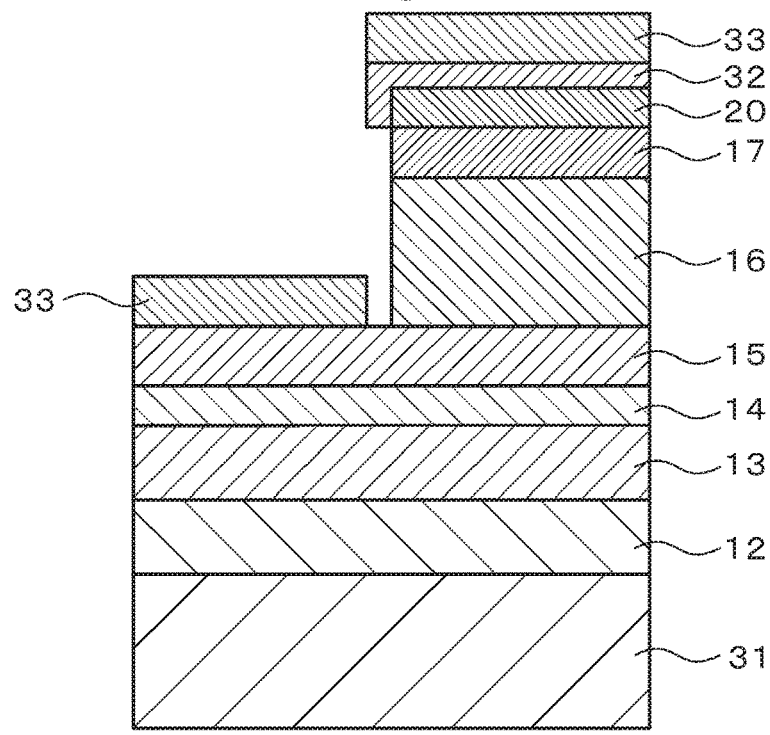
FIG. 10 A schematic view showing a method for making the GaN-based HBT according to the first embodiment of the invention.
Figure 11:
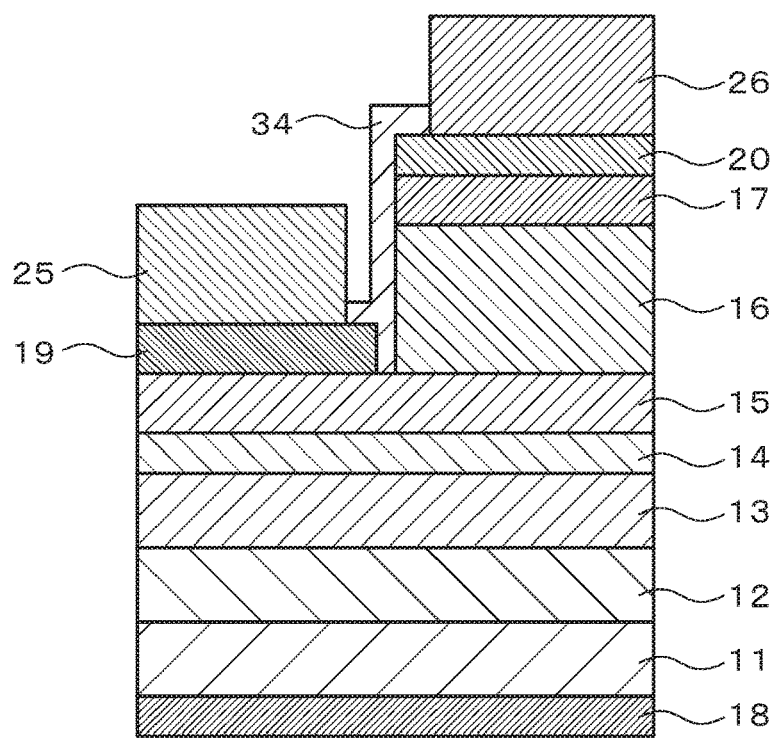
FIG. 11 A schematic view showing a method for making the GaN-based HBT according to the first embodiment of the invention.

Then, as shown in FIG. 10, a metal film 33 for forming a base electrode is formed by performing vacuum evaporation from the direction perpendicular to the n-type GaN substrate 31, and thereafter a heat treatment is performed to improve the ohmic contact characteristics of the metal film 33 formed on the p-type GaN layer 15 for the p-type GaN layer 15. When the base electrode 19 is formed by a Ni/Au stacked film, the heat treatment is performed under conditions of, for example, $N_2$ gas atmosphere, 500° C. and 1 minute. Then, the $SiO_2$ film 32 is removed by wet etching and the metal film 33 on the $SiO_2$ film 32 is removed. With this, as shown in FIG. 11, the base electrode 19 made of the metal film 33 is formed on only the p-type GaN layer 15.

Then, an insulating film 34 such as a $SiO_2$ film and a polyimide film is formed on the whole surface by vacuum evaporation method etc., and thereafter a resist pattern having openings corresponding to parts for forming a base pad electrode and a collector pad electrode is formed on the insulating film 34 by photolithography. Then, a metal film (not illustrated) such as an Au film etc. serving as an underlayer metal for electroplating is formed on the whole surface by performing vacuum evaporation from the direction perpendicular to the n-type GaN substrate 31, and thereafter the metal film is removed by removing the resist pattern on which the metal film is formed. Then, a layer such as an Au film is selectively formed on the metal film serving as the underlayer metal by electroplating. The thickness of the electroplated layer is, for example, about 1 μm. With this, formed are the base pad electrode 25 electrically connected to the base electrode 19 and the collector pad electrode 26 electrically connected to the collector electrode 20.

Then, wrapping, polishing, etc. are performed from the back side of the n-type GaN substrate 31 and finally a wet etching is performed to thin the n-type GaN substrate 31 to a prescribed thickness. The thinned n-type GaN substrate 31 forms the $n^+$-type GaN layer 11. Thereafter, a metal film for forming an emitter electrode is formed on the back side of the $n^+$-type GaN layer 11 by vacuum evaporation method etc. and the metal film is patterned, if necessary. With this, the emitter electrode 18 is formed. Here, since the back side of the $n^+$-type GaN layer 11 is an N plane in which N atoms of the GaN crystal are arranged, low resistance ohmic contact can be realized without performing a heat treatment (alloying treatment) after the metal film for forming an emitter electrode is formed.

As described above, the target GaN-based HBT is made.

Another method for making the GaN-based HBT is now described.

Figure 12:
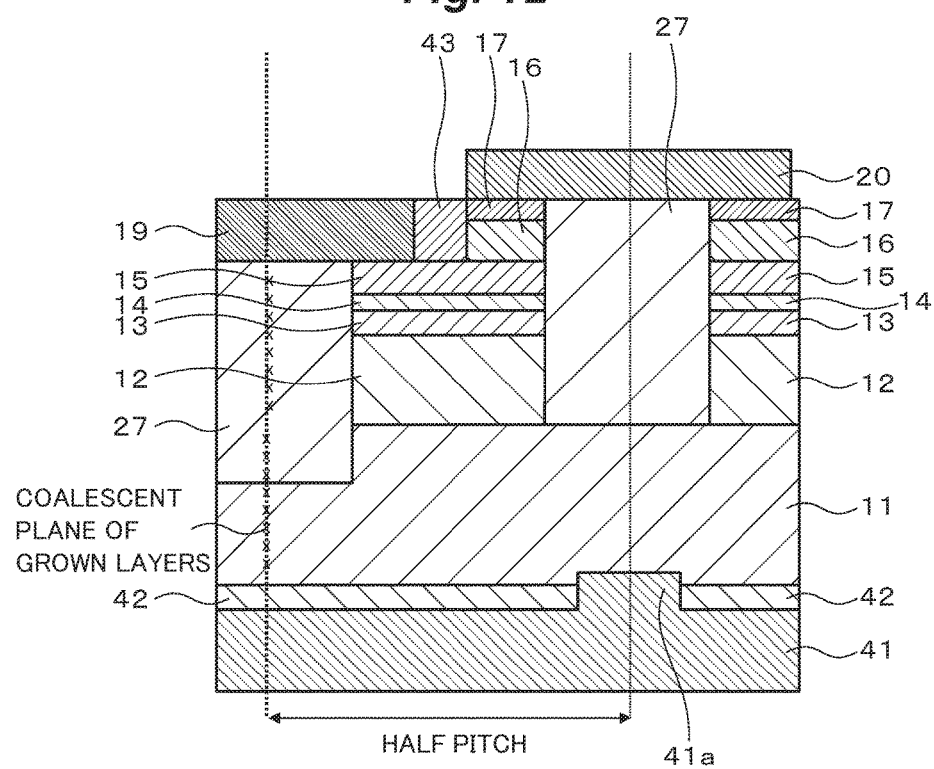
FIG. 12 A cross-sectional view showing another method for making the GaN-based HBT according to the first embodiment of the invention.

In the method, a conventionally known PENDEO method is used to grow GaN-based semiconductor layers. That is, as shown in FIG. 12, first, the major plane of a base substrate 41 such as an insulating substrate such as a sapphire substrate etc. and a Si substrate is patterned by etching to form convex parts 41a having a stripe shape parallel to each other. The height and the width of the convex parts 41a are appropriately selected. Then, an insulating film 42 such as a $SiO_2$ film, a SiN film, etc. is formed on the major plane of the base substrate 41 except the convex parts 41a. Here, the upper portion of the convex part 41a is exposed. Then, an $n^+$-type GaN is grown by a MOCVD method. In this case, the $n^+$-type GaN first grows on the side of the upper portion of the convex part 41a and the $n^+$-type GaN grows in the lateral direction (direction parallel to the major plane of the base substrate 41) and the vertical direction, so that the $n^+$-type GaN layer 11 grows. In the $n^+$-type GaN layer 11, crystal defects such as dislocations etc. (shown by x in FIG. 12) are generated in the interface (coalescent plane of the grown layers) in which two grown layers laterally grown from the sides of the two convex parts 41a are adjacent to each other. Then, grown in order on the $n^+$-type GaN layer 11 are the n-type GaN layer 12, the undoped $Al_xGa_{1-x}N$ layer 13, the undoped GaN layer 14, the p-type GaN layer 15, the n-type GaN layer 16 and the n⁺-type GaN layer 17. The crystal defects generated in the coalescent planes of the n⁺-type GaN layer 11 propagate to the n-type GaN layer 12, the undoped $Al_xGa_{1-x}N$ layer 13, the undoped GaN layer 14, the p-type GaN layer 15, the n-type GaN layer 16 and the n⁺-type GaN layer 17. Regions of the n⁺-type GaN layer 11, the n-type GaN layer 12, the undoped $Al_xGa_{1-x}N$ layer 13, the undoped GaN layer 14, the p-type GaN layer 15, the n-type GaN layer 16 and the n⁺-type GaN layer 17 which are sandwiched between the two coalescent planes of the grown layers adjacent to each other are high quality crystal layers. Then the n-type GaN layer 16 and the n⁺-type GaN layer 17 are patterned into a prescribed shape. Then, an insulating film such as a $SiO_2$ film, a SiN film, etc. is formed on the whole surface. Thereafter, a resist pattern having a prescribed shape is formed on the insulating film and the insulating film is etched by using the resist pattern as a mask and patterned into a prescribed shape. Then, for example, ion implantation of boron (B) is performed in a prescribed condition by using the insulating film as a mask. With this, high resistance layers 27 made of B-implanted layers are formed in a part of the n⁺-type GaN layer 11, the n-type GaN layer 12, the undoped $Al_xGa_{1-x}N$ layer 13, the undoped GaN layer 14 and the p-type GaN layer 15 in which the n-type GaN layer 16 and the n⁺-type GaN layer 17 are removed and in a part of the n-type GaN layer 12, the undoped $Al_xGa_{1-x}N$ layer 13, the undoped GaN layer 14, the p-type GaN layer 15, the n-type GaN layer 16 and the n⁺-type GaN layer 17 in which the n-type GaN layer 16 and the n⁺-type GaN layer 17 remain. Then, as the same as the above-mentioned method for making a GaN-based HBT, the collector electrode 20 is formed on the n⁺-type GaN layer 17, the base electrode 19 is formed on the p-type GaN layer 15 and the insulating film 43 such as a $SiO_2$ film etc. is formed on a part between the collector electrode 20 and the base electrode 19.

Figure 13:
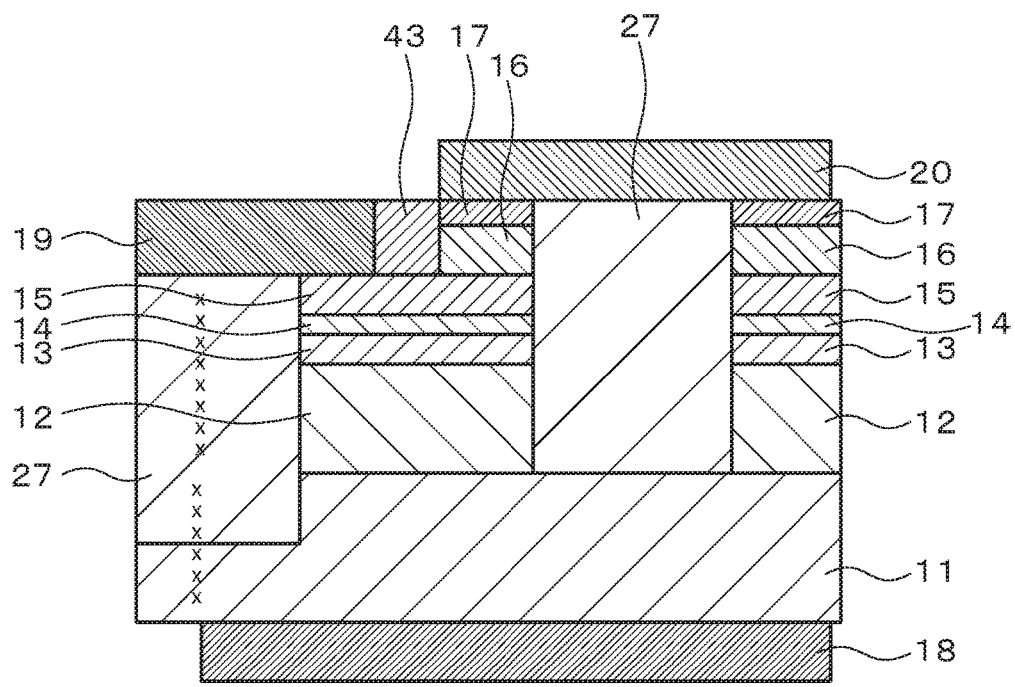
FIG. 13 A cross-sectional view showing another method for making the GaN-based HBT according to the first embodiment of the invention.

Then, as shown in FIG. 13, the base substrate 41 is peeled and further the back side of the n⁺-type GaN layer 11 is polished to obtain a flat surface and finally the emitter electrode 18 is formed on the flat back side.

Thereafter, although not illustrated, the base pad electrode 25 and the collector pad electrode 26 are formed as the same as the above-mentioned method for making a GaN-based HBT.

As described above, the target GaN-based HBT is made.

Here, described is the ground of setting the hole concentration of the base not less than $1\times10^{13}$ [cm⁻²], that is, $p\times b\times10^{-7}+P_s \geq 1\times10^{13}$ [cm⁻²].

In the GaN-based HBT, it is desirable to increase the hole concentration of the base as high as possible so as to keep the base potential high. However, if the p-type GaN layer 15 forming the base is heavily doped with Mg during its growth, Mg diffuses on the side of the undoped $Al_xGa_{1-x}N$ layer 13 forming the emitter by crossing the hetero interface between the p-type GaN layer 15 and the undoped $Al_xGa_{1-x}N$ layer 13. As a result, the p-n junction interface moves into the undoped $Al_xGa_{1-x}N$ layer 13 and therefore the gain $\beta=I_c/I_b$ decreases due to increase of the reactive base current. It is therefore indispensable for a high performance GaN-based HBT to generate holes near the heterojunction between the base and the collector without depending on Mg. In the GaN-based HBT, the subject is solved by preventing diffusion of Mg into the undoped $Al_xGa_{1-x}N$ layer 13 with provision of the undoped GaN layer 14 served as the diffusion barrier layer of Mg between the p-type GaN layer 15 and the undoped $Al_xGa_{1-x}N$ layer 13 and by forming the 2DHG 24 in the undoped GaN layer 14.

When the GaN-based HBT is in an off state (base-emitter voltage $V_{be}=0$ V), the base/collector p-n junction depletes by application of the reverse bias voltage. In this case, the high concentration hole is necessary for the base to keep the base potential. If the base potential decreases, it becomes impossible to control the emitter current due to the so-called punch-through phenomenon.

Generally, with respect to the p-n junction, the relation between the depletion layer width W and the applied voltage $V_t$, the acceptor concentration $N_A$ and the donor concentration $N_D$ is expressed as:

$$W=[(2\varepsilon/q)\{(1/N_A)+(1/N_D)\}V_t]$$

where ε is the permittivity of GaN, q is the magnitude of electronic charge and the electrical activation ratios of both acceptors and donors are supposed to be 100%. The expanse of the depletion layer is estimated in relation to punch-through. Suppose now that the acceptor concentration $N_A$ is $1\times10^{18}$ cm⁻³ and the donor concentration $N_D$ is $5\times10^{16}$ cm⁻³. When the applied voltage $V_t$ is 100V, W~1500 nm from the above equation. According to the above equation, the depletion layer extends toward the side of the collector having the low donor concentration, while the depletion layer extends toward the side of the base in the ratio of about $5\times10^{16}/1\times10^{18}=1/20$ and therefore the depletion layer of the base is 1500/20~75 nm thick. From this, in order to prevent punch-through from occurring to the side of the base, the thickness of the p-type GaN-layer 15 is necessary to be not less than about 100 nm. Therefore, the thickness of the p-type GaN layer 15 of the high frequency GaN-based HBT having the resistance voltage of 100V is roughly estimated to be not less than about 100 nm when the hole concentration of the p-type GaN layer 15 is p~$1\times10^{18}$ cm⁻³. Here, the total amount of holes in the base (sheet concentration) is $1\times10^{18}\times 100\times10^{-7}=1\times10^{13}$ cm⁻².

In conclusion, the condition necessary for the high frequency GaN-based HBT is that the hole concentration of the base is not less than $1\times10^{13}$ cm⁻².

In order to set the hole concentration of the p-type GaN layer 15 to $1\times10^{18}$ cm⁻³ by doping Mg, the Mg concentration of $1\times10^{20}$ cm⁻³ is necessary because the electrical activation ratio of Mg is about 1%. However, such a high concentration Mg doping leads to deterioration of crystal quality of the p-type GaN layer 15, so that electron-hole recombination results in the p-type GaN layer 15 and the current gain lowers. Therefore, it is desirable to lower the Mg concentration of the p-type GaN layer 15 less than $1\times10^{20}$ cm⁻³. For this purpose, it is indispensable to make the hole concentration high without relying upon a high concentration Mg doping. In order to realize this, a heterojunction is formed by the undoped $Al_xGa_{1-x}N$ layer 13 and the undoped GaN layer 14 to form the 2DHG 24 in a part of the undoped GaN layer 14 near the hetero-interface between the undoped $Al_xGa_{1-x}N$ layer 13 and the undoped GaN layer 14, and holes in the 2DHG 24 are used.

It is important to increase the hole concentration of the 2DHG 24. Described here the reason why the Al composition x and the thickness t [nm] of the undoped $Al_xGa_{1-x}N$ layer 13 are determined as described above.

Experiment

For consideration, the relation between the Al composition x and the thickness t [nm] of the undoped $Al_xGa_{1-x}N$ layer 13 and the hole concentration of the 2DHG 24 was investigated by experiment and simulation.

For this purpose, samples were prepared as described below.

Figure 14:
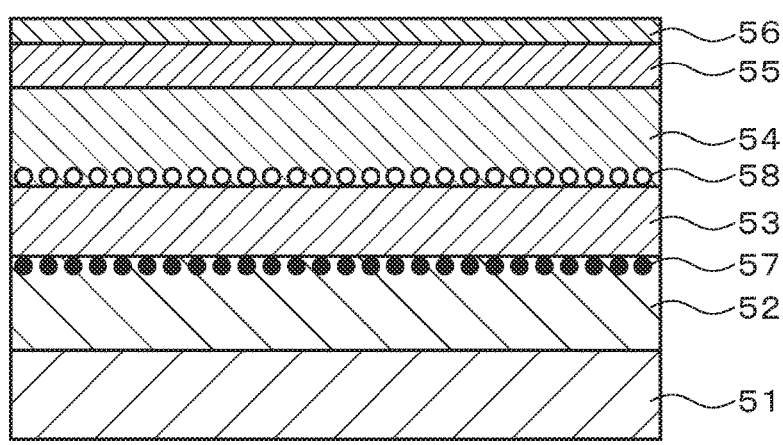
FIG. 14 A cross-sectional view showing the layer structure of a sample used in an experiment performed to study the GaN-based HBT according to the first embodiment of the invention.

First, the layer structure shown in FIG. 14 was prepared. As shown in FIG. 14, stacked on a (0001) plane, that is, C-plane sapphire substrate 51 was a low temperature growth (530° C.) GaN buffer layer (not illustrated) having a thickness of 30 nm by MOCVD method using TMG as Ga source, TMA as Al source, NH$_3$ as nitrogen source, N$_2$ gas and H$_2$ gas as a carrier gas. Then the growth temperature was raised to 1100° C. and an undoped GaN layer 52 having a thickness of 800 nm, an Al$_x$Ga$_{1-x}$N layer 53 having a thickness of 40 nm and x=0.27, an undoped GaN layer 54 having a thickness of 80 nm, a Mg-doped p-type GaN layer 55 having a Mg concentration of $5.0 \times 10^{19}$ cm$^{-3}$ and a thickness of 50 nm and a Mg-doped p$^+$-type GaN contact layer 56 having a Mg concentration of $2.0 \times 10^{20}$ cm$^{-3}$ and a thickness of 3 nm were grown in order. A 2DEG 57 is formed in a part of the undoped GaN layer 52 near the hetero interface between the Al$_x$Ga$_{1-x}$N layer 53 and the undoped GaN layer 52 and the 2DHG 58 is formed in a part of the undoped GaN layer 54 near the hetero interface between the Al$_x$Ga$_{1-x}$N layer 53 and the undoped GaN layer 54. With respect to the GaN-based HBT shown in FIG. 1, the undoped GaN layer 52 corresponds to the n-type GaN layer 12, the Al$_x$Ga$_{1-x}$N layer 53 corresponds to the undoped Al$_x$Ga$_{1-x}$N layer 13, the undoped GaN layer 54 corresponds to the undoped GaN layer 14, the 2DEG 57 corresponds to the 2DEG 23 and the 2DHG 58 corresponds to the 2DHG 24.

Figure 15:
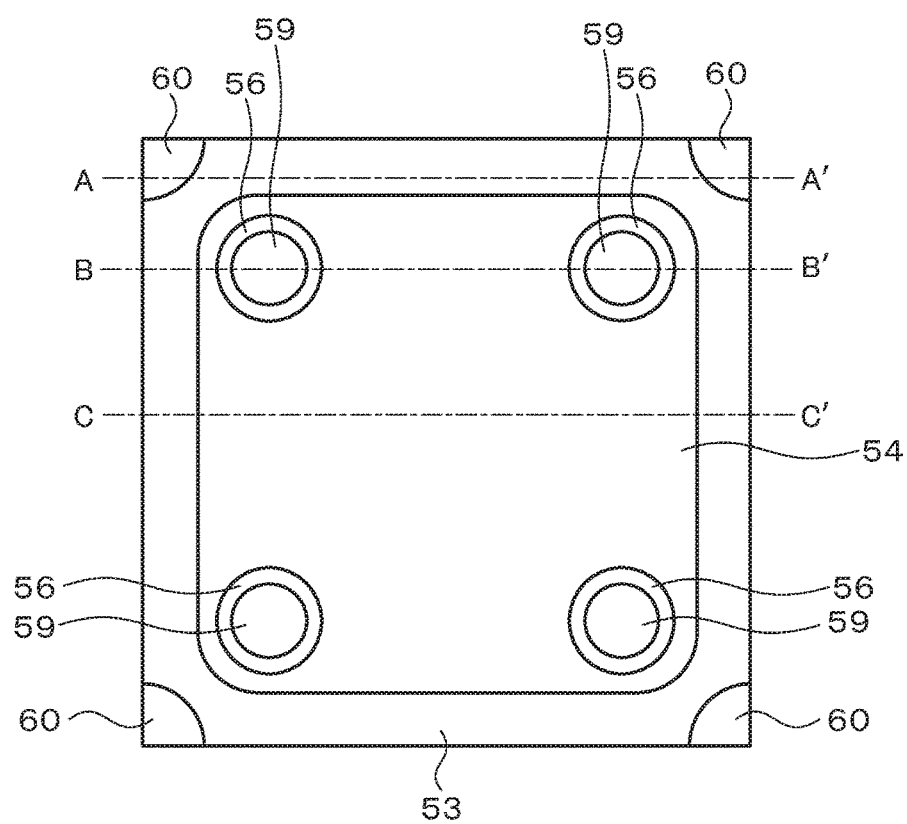
FIG. 15 A plan view showing a Hall measurement sample made in the experiment performed to study the GaN-based HBT according to the first embodiment of the invention.
Figure 16A:
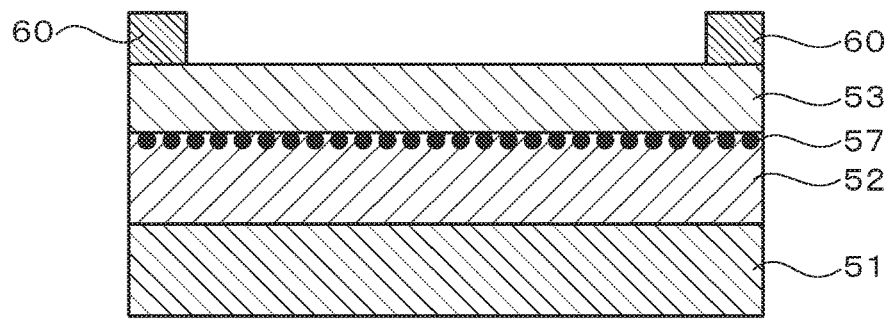
FIG. 16A A schematic view along the A-A' line of the Hall measurement sample shown in FIG. 15.
Figure 16B:
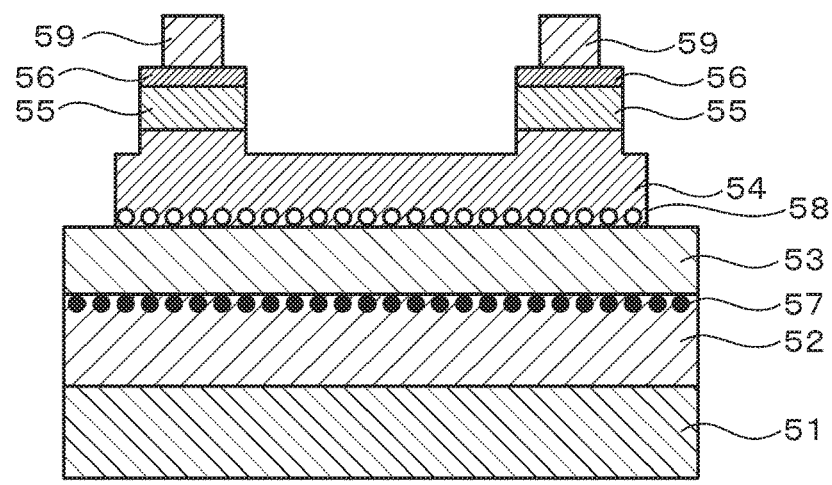
FIG. 16B A schematic view along the B-B' line of the Hall measurement sample shown in FIG. 15.
Figure 16C:
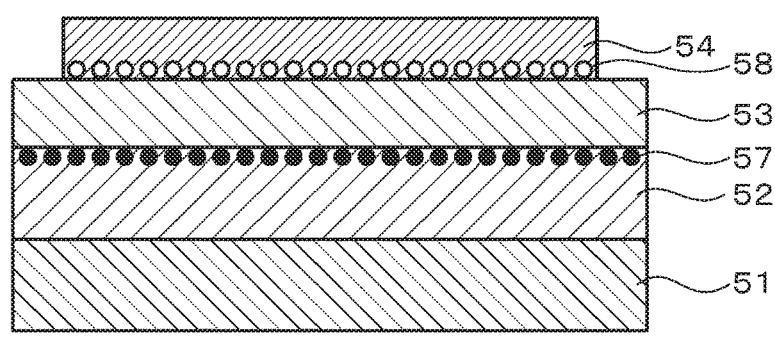
FIG. 16C A schematic view along the C-C' line of the Hall measurement sample shown in FIG. 15.

In order to measure the concentration (hereinafter, a concentration with a unit of cm$^{-2}$ denotes a sheet concentration and a concentration with a unit of cm$^{-3}$ denotes a volume concentration) of the 2DHG by using the layer structure shown in FIG. 14, a Hall element shown in FIG. 15, FIG. 16A, FIG. 16B and FIG. 16C was made. Here, FIG. 15 is a plan view of the Hall element and FIG. 16A, FIG. 16B and FIG. 16C are cross-sectional views along the A-A' line, the B-B' line and the C-C' line of FIG. 15, respectively. Etching was performed to the halfway depth of the undoped GaN layer 54 and concentrations of the 2DEG 57 and the 2DHG 58 were measured. Four p-electrodes 59 formed on the p$^+$-type GaN contact layer 56 on four corners of undoped GaN layer 54 were used to measure the concentration of the 2DHG 58. Four electrodes 60 formed on four corners of the Al$_x$Ga$_{1-x}$N layer 53 were used to measure the concentration of the 2DEG 57.

The result of measurement is shown in Table 1. The remaining thickness of the undoped GaN layer 54 of the sample No. 1 was 60 nm. The remaining thickness of the undoped GaN layer 54 of the sample No. 2 was 40 nm. The remaining thickness of the undoped GaN layer 54 of the sample No. 3 was 5 nm. It is understood from Table 1 that in the sample No. 1 and the sample No. 2, the 2DEG 57 and the 2DHG 58 are induced and accumulated by the polarization super junction (PSJ) effect. With respect to the sample No. 3, the Hall voltage for holes was not generated and measurement was impossible.

TABLE 1

| SAMPLE | No. 1 REMAINING THICKNESS OF UNDOPED GaN LAYER = 60 nm | No. 2 REMAINING THICKNESS OF UNDOPED GaN LAYER = 40 nm | No. 3 REMAINING THICKNESS OF UNDOPED GaN LAYER = 5 nm |
|---|---|---|---|
| 2DHG CONCENTRATION [cm$^{-2}$] | $7.08 \times 10^{12}$ | $6.60 \times 10^{12}$ | UNMEASURABLE |
| HOLE MOBILITY [cm$^2$/Vs] | 6.05 | 5.2 | UNMEASURABLE |
| 2DEG CONCENTRATION [cm$^{-2}$] | $6.78 \times 10^{12}$ | $6.43 \times 10^{12}$ | $8.15 \times 10^{12}$ |
| ELECTRON MOBILITY [cm$^2$/Vs] | 863.5 | 871.0 | 880.6 |

Because the 2DHG concentration of the sample No. 2 is less than the 2DHG concentration of the sample No. 1, it was shown that the 2DHG concentration depends on the thickness of the undoped GaN layer 54. This results from the surface pinning effect and the existence of donor type levels (electron emission type) or hole trapping levels of the undoped GaN layer 54. The relation between the amount of 2DHG 58 and the constitution of the Al$_x$Ga$_{1-x}$N layer 53 and the undoped GaN layer 53 was examined quantitatively.

[Comparison Between Model Calculation and the 2DHG Concentration Measured]

In order to derive the relation between the layer structure of the polarization super junction consisting of the Al$_x$Ga$_{1-x}$N layer 53/the undoped GaN layer 54 and the 2DHG concentration, the band calculations were carried out. That is, the calculations were carried out for a one-dimensional model along the stacking direction in FIG. 16A, FIG. 16B and FIG. 16C. Atlas of Silvaco, Inc. was used as a simulator software. FIG. 17 shows the band diagram calculated of the undoped GaN layer 54 (thickness 60 nm)/the Al$_x$Ga$_{1-x}$N layer 53 (x=0.24, thickness 40 nm)/the undoped GaN layer 52 in an equilibrium state. FIG. 18 shows the concentration profile of the 2DHG and the 2DEG. Band bending occurs by the positive fixed charge (polarization charge) induced in a part of the Al$_x$Ga$_{1-x}$N layer 53 near the hetero interface between the undoped GaN layer 52 and the Al$_x$Ga$_{1-x}$N layer 53 and the negative fixed charge (polarization charge) induced in a part of the Al$_x$Ga$_{1-x}$N layer 53 near the hetero interface between the Al$_x$Ga$_{1-x}$N layer 53 and the undoped GaN layer 54. As a result, the 2DHG is induced in a part of the undoped GaN layer 54 near the hetero interface between the Al$_x$Ga$_{1-x}$N layer 53 and the undoped GaN layer 54 and the 2DEG is induced in a part of the undoped GaN layer 52 near the hetero interface between the Al$_x$Ga$_{1-x}$N layer 53 and the undoped GaN layer 52. The peak concentration of the 2DHG is $1 \times 10^{20}$ cm$^{-3}$ and the peak concentration of the 2DEG is $6 \times 10^{19}$ cm$^{-3}$ and both concentrations decrease exponentially with the distance from the hetero interface. The 2DEG concentration shows a constant value, $1 \times 10^{15}$ cm$^{-3}$ in the deep position of the undoped GaN layer 52 because the undope level of the undoped GaN layer 52 was set to $1 \times 10^{15}$ cm$^{-3}$ for the sake of calculation. This will not affect discussions below.

The integral value of the carrier concentration in the depth direction shows the sheet carrier concentration. FIG. 19 shows the 2DHG concentration as the sheet carrier concentration. In FIG. 19, the thickness of the undoped GaN layer 54 is shown in the abscissa and the 2DHG concentration is shown in the ordinate. The 2DHG concentrations of the sample No. 1 and the sample No. 2 are plotted in FIG. 19.

It is understood from FIG. 19 that the result of simulation (calculated values by the band calculation) reproduces the measured values well and parameters of physical properties of matter of the model used in the simulation (its details are not shown) satisfy a necessary condition for the purpose of exploring the practical polarization super junction structure.

As shown in FIG. 19, according to the simulation, the 2DHG concentration is calculated to be about $1\times10^{12}$ cm$^{-2}$ for the thickness of 7 nm of the undoped GaN layer 54. In this region, the 2DHG concentration drastically decreases as the thickness of the undoped GaN layer 54 decreases and is $0.6\times10^{12}$ cm$^{-2}$ for the thickness of 5 nm. Measurement of the corresponding sample was impossible. Its reason is as follows. Suppose that the hole mobility is about 3 cm$^2$/Vs. When the 2DHG concentration of the sample is $0.6\times10^{12}$ cm$^{-2}$ as described above, the sheet resistance is $1/ne\mu = 1/(0.6\times10^{12}\times1.6\times10^{-19}\times3) \sim 3.5$ M$\Omega$/□. It is difficult to carry out Hall measurement for the sample with such a sheet resistance. Here, n is the sheet concentration, e is the magnitude of electronic charge and $\mu$ is the hole mobility. It is possible that the etching damage caused during etching for forming a mesa reaches to the hetero interface between the undoped GaN layer 54 and the Al$_x$Ga$_{1-x}$N layer 53 to decrease further the 2DEG concentration. This may be another reason for a problem of impossible measurement. This shows that there is a limit of the remaining thickness of the undoped GaN layer 54 in an actual device fabrication and the thickness of 5 nm is too small. In addition, even if there is no effect of the surface damage, there is still a limit of the remaining thickness of the undoped GaN layer 54, taking accuracy of etching during device fabrication into consideration, and it is considered that the thickness of not less than 10 nm is actually needed.

When the 2DHG concentration is $1\times10^{11}$ cm$^{-2}$, there is no problem in principle. However, in order to obtain the hole concentration of the base not less than $1\times10^{13}$ [cm$^{-2}$] without increasing the Mg concentration of the p-type GaN layer 15 too much, the 2DHG concentration is preferably not less than $1\times10^{12}$ cm$^{-2}$ at least and more preferably larger. The thickness of the undoped GaN layer 54 is desired to be large because the 2DHG concentration becomes larger as the thickness becomes larger. However, when the thickness of the undoped GaN layer 54 is too large, it becomes impossible to make the device. Therefore, the thickness of the undoped GaN layer 54 is desired to be not larger than 1000 nm. This is the reason why the thickness of the undoped GaN layer 14 is desired to be not larger than 1000 nm.

[Calculation to Investigate the Relation Between the Al Composition x and the Thickness t of the Undoped Al$_x$Ga$_{1-x}$N Layer 53 and the 2DHG Concentration in the Polarization Super Junction Structure Consisting of the Undoped GaN Layer 54/the Undoped Al$_x$Ga$_{1-x}$N Layer 53]

The thickness a of the undoped GaN layer 54 was used as parameters and set to a=10 nm, 50 nm, 100 nm and 1000 nm, respectively. The 2DHG concentration was calculated while the Al composition x and the thickness t of the Al$_x$Ga$_{1-x}$N layer 53 were varied. Here, x was varied by 0.05 in a range of 0.05~0.5 (5~50%) and t was varied by 1 nm in a range of 5~10 nm and by 5 nm in a range of 10~100 nm. And calculation was carried out by combining each value of x and each value of t like a matrix. The result of calculation of the Al composition x and the thickness t of the Al$_x$Ga$_{1-x}$N layer 53 described below can be applied to the Al composition x and the thickness t of the undoped Al$_x$Ga$_{1-x}$N layer 13 of the GaN-based HBT as it is.

FIG. 20 shows a table of calculated values of the 2DHG concentration for the Al composition x and the thickness t (nm) of the undoped Al$_x$Ga$_{1-x}$N layer 53 when the thickness a of the undoped GaN layer 54 is 10 nm. Needless to say, in FIG. 20, for example, "1.03E+12" means $1.03\times10^{12}$ (similar in FIG. 21 to FIG. 23). FIG. 21 shows a similar table of calculated values of the 2DHG concentration when the thickness a of the undoped GaN layer 54 is 50 nm. FIG. 22 shows a similar table of calculated values of the 2DHG concentration when the thickness a of the undoped GaN layer 54 is 100 nm. FIG. 23 shows a similar table of calculated values of the 2DHG concentration when the thickness a of the undoped GaN layer 54 is 1000 nm.

Inspecting the state of distribution of the 2DHG concentration shown in FIG. 20 to FIG. 23, it is understood that as x becomes large and t becomes large, the 2DHG concentration increases. Values of x and t giving the concentration of $1.00\times10^{12}$ cm$^{-2}$ are extracted. Here, in FIG. 20 to FIG. 23, cells near the 2DHG concentration of $1.00\times10^{12}$ cm$^{-2}$ are surrounded by a thick line. Since the values of cells in tables are not exactly $1.00\times10^{12}$ cm$^{-2}$, values of x and t were obtained from the values of the cells in front of and behind the cell in proportional distribution.

Figure 24:
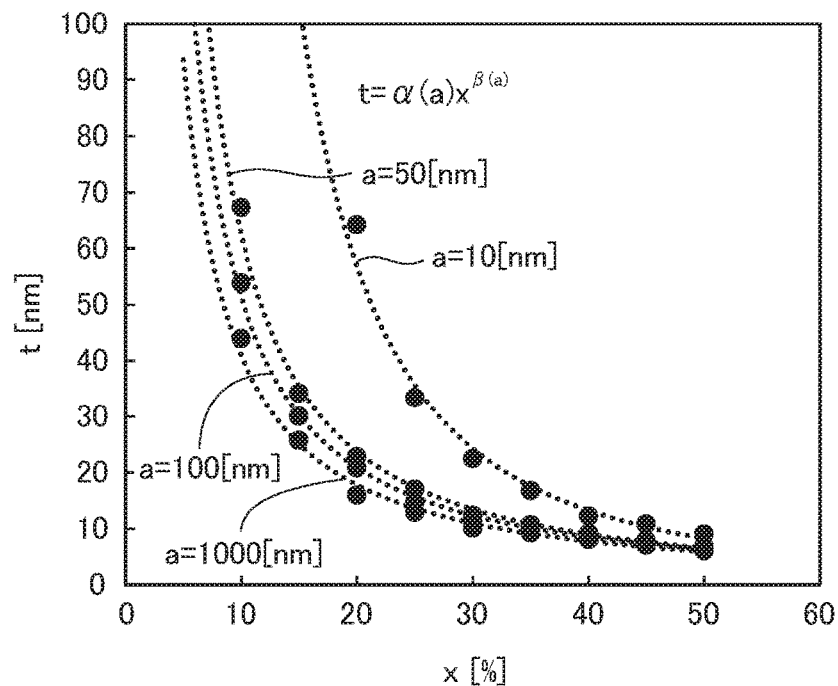
FIG. 24 A schematic view showing the relation between the Al composition x and the thickness t of the Al$_x$Ga$_{1-x}$N layer 53 where the remaining thickness of the undoped GaN layer 54 is changed.

FIG. 24 shows the (x, t) coordinate plane in which points of (x, t) showing values of the 2DHG concentration=$1\times10^{12}$ cm$^{-2}$, which were picked up from FIG. 20 to FIG. 23, were plotted. In FIG. 24, the region on the right side (or the upper side) of respective points is the area where the 2DHG concentration 24 $1\times10^{12}$ cm$^{-2}$. From this, it can be understood that when the thickness a of the undoped GaN layer 54 is small, the Al composition x and the thickness t of the Al$_x$Ga$_{1-x}$N layer 53 to obtain the 2DHG concentration of not less than $1\times10^{12}$ cm$^{-2}$ are large. It was made clear that as the thickness a of the undoped GaN layer 54 increases to 100 nm or more, the change of the 2DHG concentration saturates. This is understood that the band shape near the hetero interface between the undoped GaN layer 54 and the Al$_x$Ga$_{1-x}$N layer 53 does not change even if the thickness a of the undoped GaN layer 54 increases.

Obtained now is an approximate equation expressing values of coordinate (x, t) in respective series of the thickness a of the undoped GaN layer 54 shown in FIG. 24. The approximate equation expresses the approximate curve giving the 2DHG concentration of $1\times10^{12}$ cm$^{-2}$. The approximate equation is expressed as follows.

$$t = \alpha(a) x^{\beta(a)} \qquad (1)$$

Here, $\alpha$ and $\beta$ are functions of the thickness a of the undoped GaN layer 54.

The curve shown by the dotted line in FIG. 24 fits to the approximate equation and values of the parameters $\alpha$ and $\beta$ of the equation (1) are as shown in Table 2.

TABLE 2

| a [nm] | α | β |
|---|---|---|
| 10 | 30689 | −2.1 |
| 50 | 1555 | −1.396 |
| 100 | 1011 | −1.295 |
| 1000 | 641 | −1.196 |

Therefore, for an arbitrary thickness a of the undoped GaN layer 54 ranging from 10 nm to 1000 nm, the thickness t of the Al$_x$Ga$_{1-x}$N layer 53 giving the 2DHG concentration=$1\times10^{12}$ cm$^{-2}$ for the Al composition x of the Al$_x$Ga$_{1-x}$N layer 53 is given by the equation (1). On the other hand, in the GaN-based HBT, although the p-type GaN layer 15 is stacked on the undoped GaN layer 14, this structure may be considered to be equivalent to the undoped GaN layer 14 having the very large thickness with respect to the 2DHG concentration. Therefore, with respect to the Al composition x and the thickness t of the $Al_xGa_{1-x}N$ layer 53 giving the 2DHG concentration of not less than $1\times10^{12}$ cm$^{-2}$, values of α and β when α=1000 nm are adopted from α and β in Table 2, so that $$t[nm] \geq 641x^{-1.196} (x \geq 10\%)$$

is satisfied.

Obtained now is the relation of the Al composition x and the thickness t of the $Al_xGa_{1-x}N$ layer 53 giving the 2DHG concentration $P_s=4\times10^{12}$ cm$^{-2}$ or $5\times10^{12}$ cm$^{-2}$.

From data of FIG. 20 to FIG. 23, the Al composition x and the thickness t giving $P_s=4\times10^{12}$ cm$^{-2}$ are as shown in Table 3.

TABLE 3

| x(%) | t(nm) |
|---|---|
| 15 | 57.80 |
| 20 | 31.75 |
| 25 | 21.73 |
| 30 | 16.42 |
| 35 | 13.11 |
| 40 | 10.63 |
| 45 | 9.05 |
| 50 | 7.83 |

Figure 25:
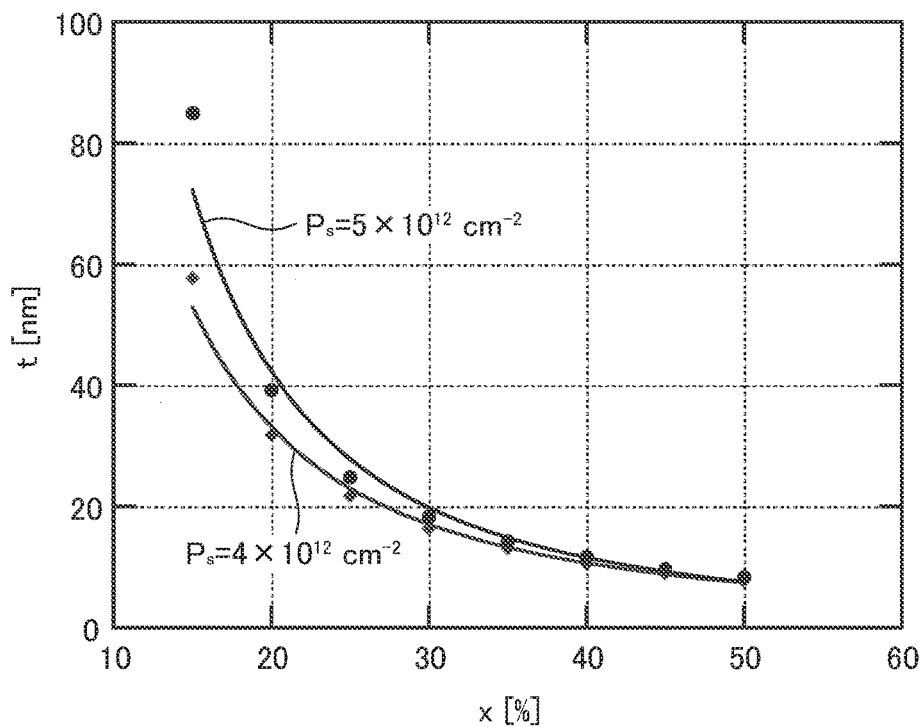
FIG. 25 A schematic view showing the relation between the Al composition x and the thickness t of the Al$_x$Ga$_{1-x}$N layer 53 which can obtain the 2DHG concentration of $4\times10^{12}$ [cm$^{-2}$] and $5\times10^{12}$ [cm$^{-2}$].

Data of Table 3 are plotted in FIG. 25. By fitting of the plotted points with $$t = \alpha x^{\beta}$$

α=4390 and β=−1.631 were obtained. Therefore, the Al composition x and the thickness t of the $Al_xGa_{1-x}N$ layer 53 giving the 2DHG concentration $P_s$ of not less than $4\times10^{12}$ cm$^{-2}$ are expressed as $$t [nm] \geq 4390 x^{-1.631}.$$

From data of FIG. 20 to FIG. 23, the Al composition x and the thickness t giving the 2DHG concentration $P_s=5\times10^{12}$ cm$^{-2}$ are as shown in Table 4.

TABLE 4

| x(%) | t(nm) |
|---|---|
| 15 | 85.0 |
| 20 | 39.2 |
| 25 | 24.0 |
| 30 | 18.4 |
| 35 | 14.3 |
| 40 | 11.8 |
| 45 | 9.77 |
| 50 | 8.34 |

Data of Table 4 are plotted in FIG. 25. By fitting of the plotted points with the equation (2), α=11290 and β=−1.865 were obtained. Therefore, the Al composition x and the thickness t of the $Al_xGa_{1-x}N$ layer 53 giving the 2DHG concentration $P_s$ of not less than $5\times10^{12}$ cm$^{-2}$ are expressed as $$t [nm] \geq 11290 x^{-1.865}.$$

Figure 26:
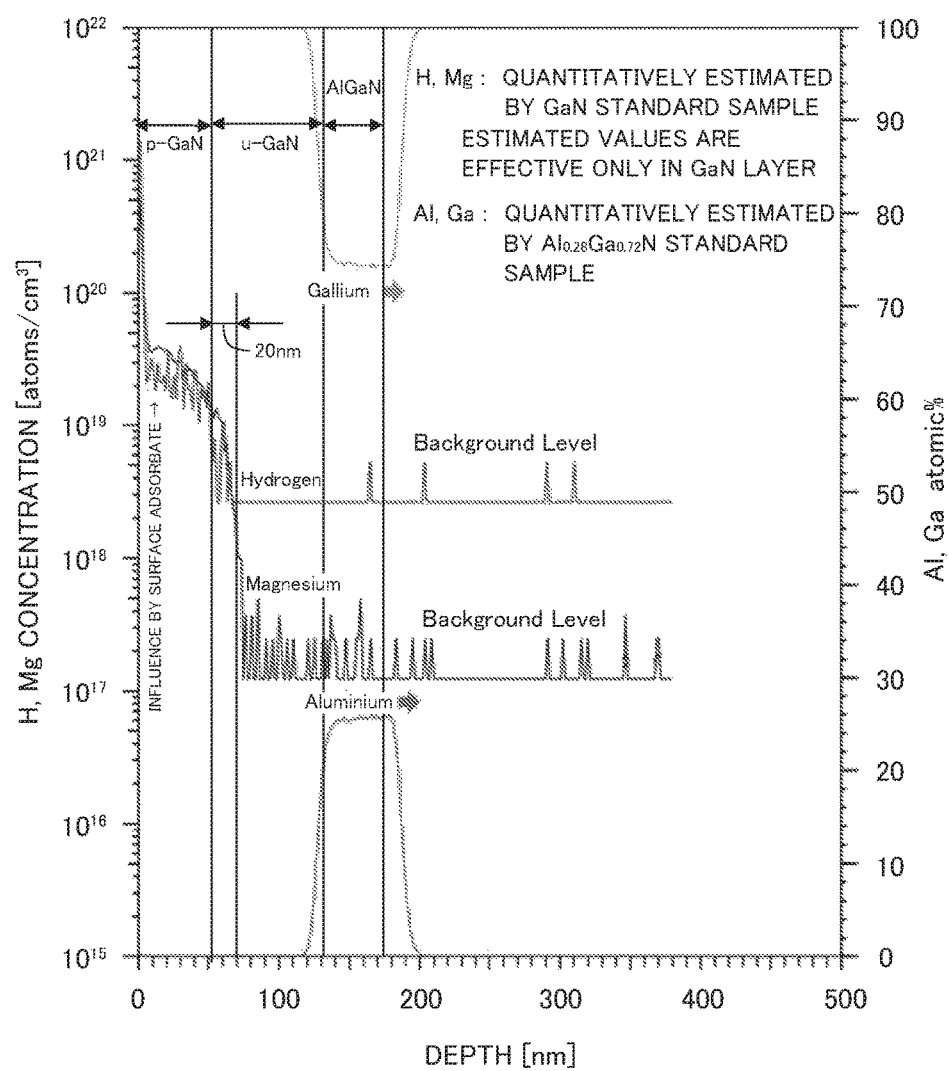
FIG. 26 A schematic view showing the result of the SIMS analysis in the depth direction of the sample shown in FIG. 14.

Described now is the reason why the thickness of the undoped GaN layer 14 is set to be not less than 20 nm. For the sample shown in FIG. 14, the depth distribution of Mg was measured by secondary ion mass spectroscopy (SIMS). The result is shown in FIG. 26. As shown in FIG. 26, it was confirmed that the Mg concentration of the undoped GaN layer 54 at a position below the p-type GaN layer 55 having the Mg concentration of $5\times10^{19}$ cm$^{-2}$, in other words, at a depth of 20 nm from the interface between the p-type GaN layer 55 and the undoped GaN layer 54 decreases to about $1.0\times10^{16}$ cm$^{-3}$, which is near the detection limit of SIMS. From this, it was understood that the undoped GaN layer having a thickness of not less than 20 nm serves as the diffusion barrier layer of Mg. This is the reason why the thickness of the undoped GaN layer 14 is set be not less than 20 nm.

Figure 27:
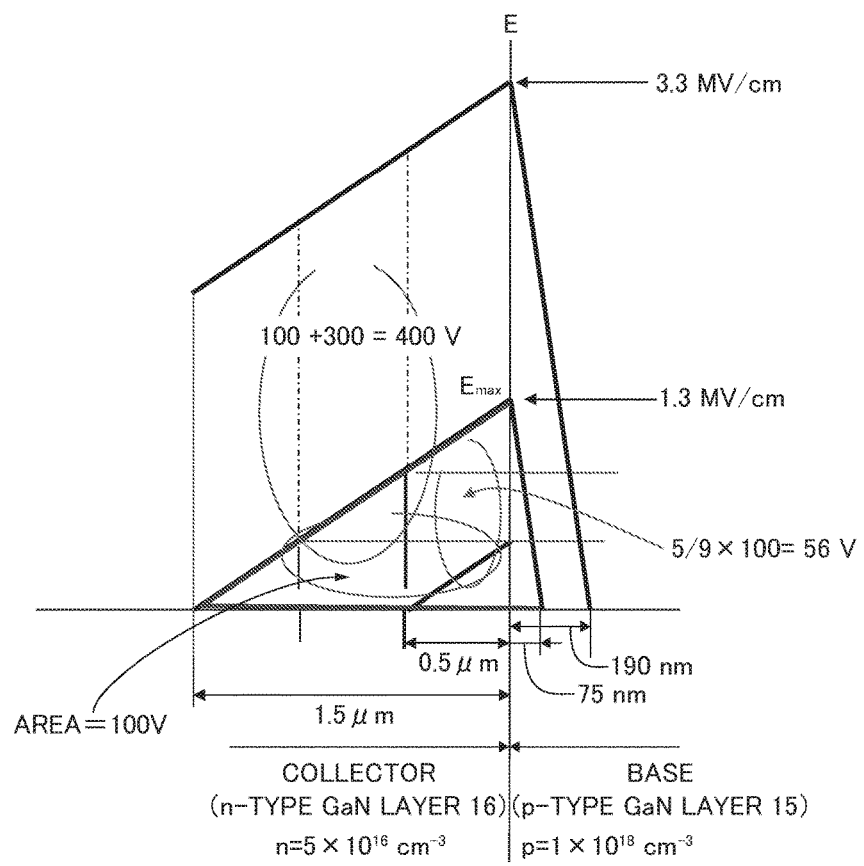
FIG. 27 A schematic view showing the result of consideration of the maximum voltage which can be applied between the base and the collector of the GaN-based HBT according to the first embodiment of the invention.

Considered now is the maximum applied voltage between the base and the collector of the GaN-based HBT. FIG. 27 shows a distribution of the electric field of the p-n junction between the p-type GaN layer 15 and the n-type GaN layer 16 of the GaN-based HBT. In FIG. 27, the vertical axis corresponds to the electric field E and the horizontal axis corresponds to the distance in the thickness direction of the p-type GaN layer 15 and the n-type GaN layer 16. Suppose that the hole concentration of the p-type GaN layer 15 is $p=1\times10^{18}$ cm$^{-3}$ and the electron concentration of the n-type GaN layer 16 is $n=5\times10^{16}$ cm$^{-3}$. For example, in the case where the thickness of the n-type GaN layer 16 constituting the collector, when a base-collector voltage $V_{ce}=100V$ is applied in a state of base-emitter voltage $V_{be}=0V$ (off state), the n-type GaN layer 16 completely depletes. In this case, the maximum electric field $E_{max}$ applied to the base-collector interface is $E_{max}=2\times100/(1.5\times10^{-4})=1.3$ MV/cm, which is much less than theoretical breakdown electric field (3.3 MV/cm).

It was investigated whether the GaN-based HBT can be used as a power switching device of $V_t=400V$. When 400−100=300V is added to $V_{ce}$, $E_{max}$ becomes as $E_{max}=1.3+2=3.3$ MV/cm. However, the distance of the region where the electric field becomes 3.3 MV/cm is very short, so it is considered that the GaN-based HBT can be used as the power switching device. On the other hand, since the depletion layer on the side of the base, i.e., the p-type GaN layer 15 extends to $(3.3/1.3)\times75=190$ nm, the thickness b of the p-type GaN layer 15 needs to be not less than this. In the GaN-based HBT in which the thickness of the n-type GaN layer 16 is 0.5 μm, the maximum applied voltage is 56V when $E_{max}$ is suppressed as $E_{max}=1.3$ MV/cm, whereas the maximum applied voltage is 100+56=156V when the electric field of $E_{max}=3.3$ MV/cm is allowed. As described above, the thickness b of the p-type GaN layer 15 needs to be not less than 190 nm.

As described above, according to the first embodiment, the hole concentration of the base is set to be not less than $1\times10^{13}$ cm$^{-2}$ by selection of the concentration of Mg doped with the p-type GaN layer 15 and selection of the concentration of the 2DHG 24 formed in the undoped GaN layer 14 in the polarization super junction between the undoped $Al_xGa_{1-x}N$ layer 13 and the undoped GaN layer 14 and further the thickness of the p-type GaN layer 15 is set to be not less than 100 nm. Therefore, when a reverse bias voltage of about 100V is applied to the p-n junction between the base and the collector in an off state of the GaN-based HBT, it is possible to effectively prevent punch-through from occurring. Furthermore, since the hole concentration of the base is not less than $1\times10^{13}$ cm$^{-2}$ and sufficiently high, it is possible to reduce the base resistance sufficiently and thereby improve the current gain of the GaN-based HBT. In addition, since the undoped GaN layer 14 having a thickness of not less than 20 nm is formed between the undoped $Al_xGa_{1-x}N$ layer 13 and the p-type GaN layer 15, it is possible to prevent Mg doped with the p-type GaN layer 15 from diffusing into the undoped $Al_xGa_{1-x}N$ layer 13. With this, it is possible to prevent the p-n junction interface from moving into the undoped $Al_xGa_{1-x}N$ layer 13 and therefore prevent reaction base current from flowing. Since the GaN-based HBT has a collector-up structure, it is possible to reduce collector capacitance drastically and therefore make operation speed of the GaN-based HBT high. Accordingly, it is possible to realize a high performance GaN-based HBT which can easily accomplish high frequency power amplification and high frequency power switching and can obtain high voltage resistance and high output. For example, in the case where the thickness of the collector is 1 µm, it is possible to realize an extremely high performance GaN-based HBT having a voltage resistance of not less than 200V, a transition frequency $f_t$ of not less than 100 GHz and a current gain $\beta=I_c/I_b$ of not less than 100, which can accomplish high frequency power amplification. In the case where the thickness of the collector is 10 µm, it is possible to realize an extremely high performance GaN-based HBT having a voltage resistance of not less than 2000V, rise time and fall time of the collector current of not larger than several ns and a current gain $\beta=I_c/I_b$ of not less than 100, which can accomplish high frequency power switching. And a high performance electric device can be realized by using the high performance GaN-based HBT.

2. The Second Embodiment

[GaN-Based HBT]

The GaN-based HBT according to the second embodiment is described. The base structure of the GaN-based HBT is shown in FIG. 28.

Figure 28:
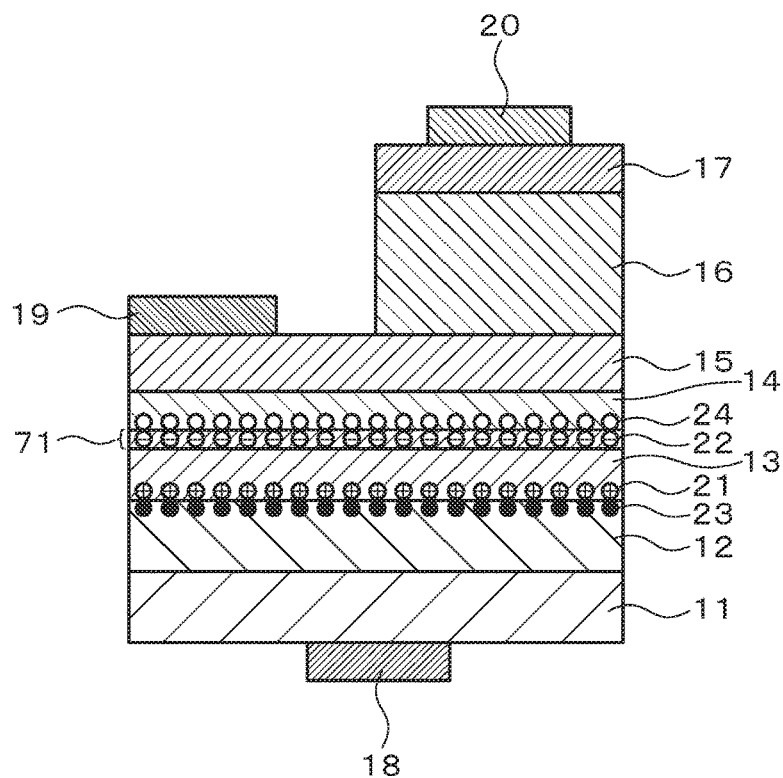
FIG. 28 A cross-sectional view showing the base structure of a GaN-based HBT according to a second embodiment of the invention.
Figure 29:
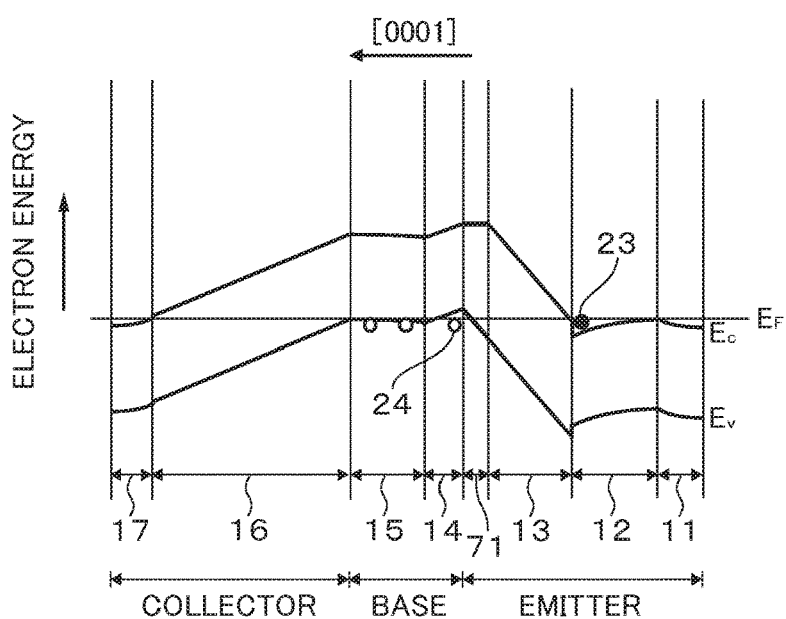
FIG. 29 A schematic view showing the energy band of the GaN-based HBT according to the second embodiment of the invention during non-operation.

As shown in FIG. 28, the GaN-based HBT has the same structure as the GaN-based HBT according to the first embodiment except that an $Al_yGa_{1-y}N$ graded layer 71 of which Al composition y monotonically increases from x to 0, for example, linearly or like a curve is formed between the undoped $Al_xGa_{1-x}N$ layer 13 and the undoped GaN layer 14. By forming the $Al_yGa_{1-y}N$ graded layer 7 between the undoped $Al_xGa_{1-x}N$ layer 13 and the undoped GaN layer 14, an energy band during non-operation is as shown in FIG. 29. As shown in FIG. 29, at the hetero interface between the $Al_yGa_{1-y}N$ graded layer 71 and the undoped GaN layer 14, y of the $Al_yGa_{1-y}N$ graded layer 71 is 0 and therefore the composition of the $Al_yGa_{1-y}N$ graded layer 71 is the same as the undoped GaN layer 14, while at the hetero interface between the $Al_yGa_{1-y}N$ graded layer 71 and the undoped $Al_xGa_{1-x}N$ layer 13, y of the $Al_yGa_{1-y}N$ graded layer 71 is x and therefore the composition of the $Al_yGa_{1-y}N$ graded layer 71 is the same as the undoped $Al_xGa_{1-x}N$ layer 13. Therefore, the conduction band and the valence band are continuous at the hetero interface between the $Al_yGa_{1-y}N$ graded layer 71 and the undoped GaN layer 14 and the hetero interface between the $Al_yGa_{1-y}N$ graded layer 71 and the undoped $Al_xGa_{1-x}N$ layer 13.

[Operation of the GaN-Based HBT]

Operation method of the GaN-based HBT according to the second embodiment is basically the same as the GaN-based HBT according to the first embodiment.

[Method for Making the GaN-Based HBT]

The method for making the GaN-based HBT according to the second embodiment is the same as the method for making the GaN-based HBT according to the first embodiment except that the $Al_yGa_{1-y}N$ graded layer 71 is formed between the undoped $Al_xGa_{1-x}N$ layer 13 and the undoped GaN layer 14.

Figure 30:
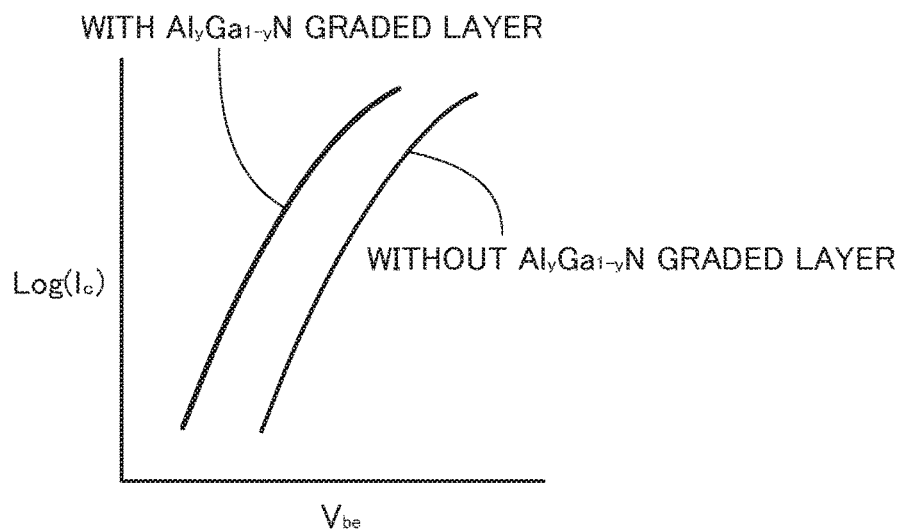
FIG. 30 A schematic view showing the base-emitter voltage-collector current characteristics of the GaN-based HBT according to the second embodiment of the invention.
Figure 31:
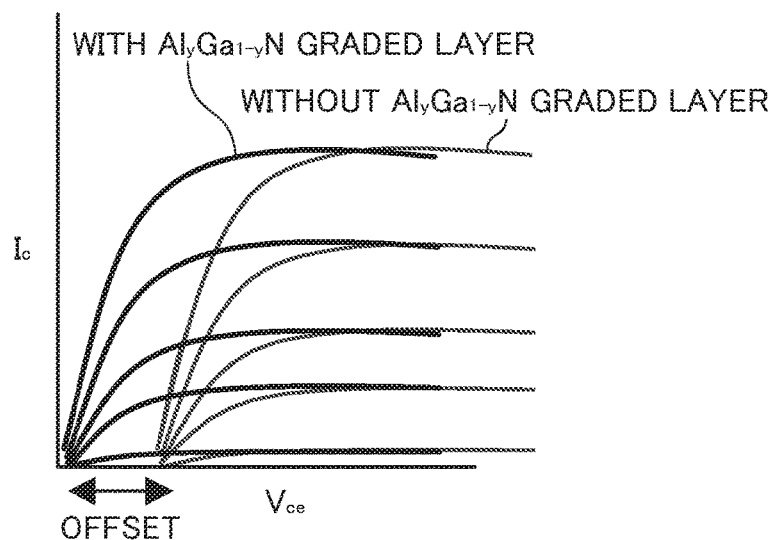
FIG. 31 A schematic view showing the output characteristics of the GaN-based HBT according to the second embodiment of the invention.

According to the second embodiment, following advantages can be obtained in addition to the same advantages as the first embodiment. That is, discontinuity of the conduction band ($\Delta E_c$) at the hetero interface between the undoped $Al_xGa_{1-x}N$ layer 13 and the undoped GaN layer 14 is eliminated, so that as shown in FIG. 30, it is possible to increase the collector current compared with the case where $\Delta E_c$ exists in the conduction band and the valence band at the hetero interface. In FIG. 30, $I_c$ denotes the collector current. As shown in FIG. 31, in the case where $\Delta E_c$ exists, an offset of collector-emitter voltage appears in output characteristics, that is, collector-emitter voltage ($V_{ce}$)-collector current ($I_c$) curve, whereas according to the second embodiment free from $\Delta E_c$ it is possible to eliminate an offset of the collector-emitter voltage.

3. The Third Embodiment

[GaN-Based HBT]

The GaN-based HBT according to the third embodiment is described. The base structure of the GaN-based HBT is shown in FIG. 32.

Figure 32:
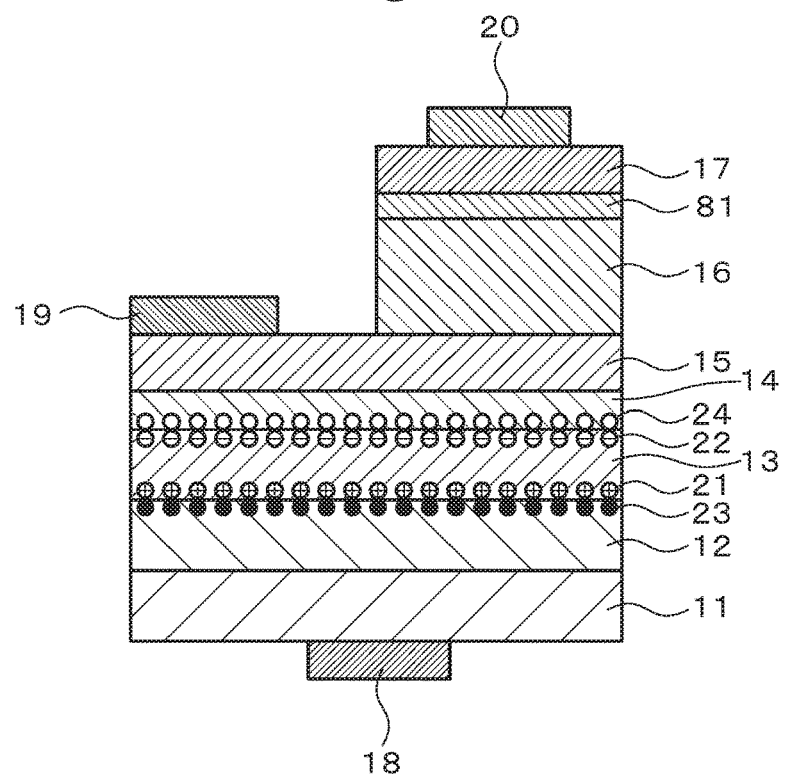
FIG. 32 A schematic view showing the base structure of a GaN-based HBT according to a third embodiment of the invention.
Figure 33:
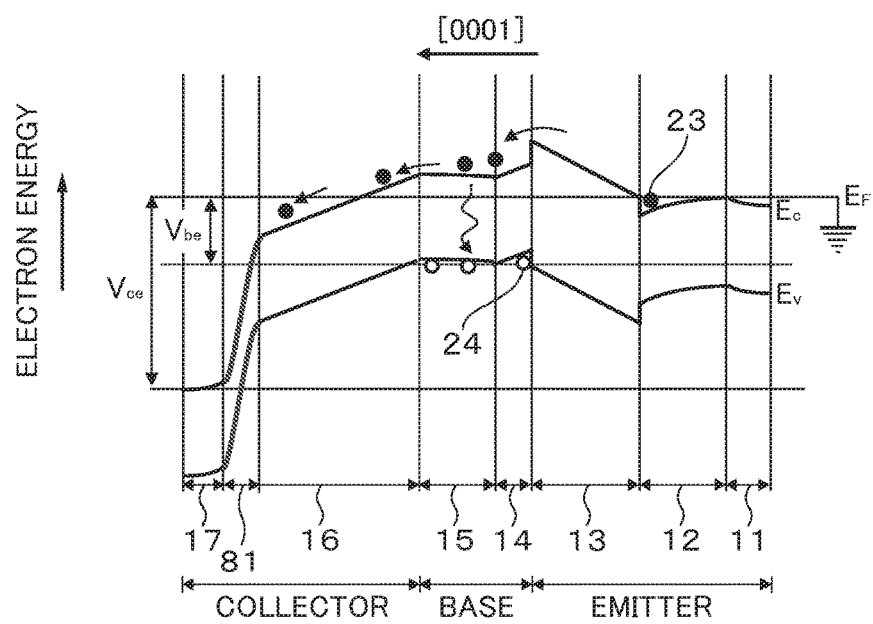
FIG. 33 A schematic view showing the energy band of the GaN-based HBT according to the third embodiment of the invention during operation.

As shown in FIG. 32, the GaN-based HBT has the same structure as the first embodiment except that a p-type GaN layer 81 is formed between the n-type GaN layer 16 and the n$^+$-type GaN layer 17. The thickness and the acceptor concentration of the p-type GaN layer 81 are appropriately selected. For example, the thickness is 5~20 nm and the acceptor concentration is $(1~8) \times 10^{19}$ cm$^{-3}$. The energy band of the GaN-based HBT during operation is as shown in FIG. 33. As shown in FIG. 33, by forming the p-type GaN layer 81 between the n-type GaN layer 16 and the n$^+$-type GaN layer 17, a slope of the energy band of the n$^+$-type GaN layer 17 is drastically decreased compared with the case where the p-type GaN layer 81 is not formed. By decreasing the thickness of the p-type GaN layer 81 to 5~20 nm, electrons which pass through the p-type GaN layer 13 and reach the n-type GaN layer 16 pass through the p-type GaN layer 81 ballistically and reach the n$^+$-type GaN layer 17, so that it is possible to make the operation speed of the GaN-based HBT high.

[Operation of the GaN-Based HBT]

The operation method of the GaN-based HBT according to the third embodiment is basically the same as the GaN-based HBT according to the first embodiment.

[Method for Making the GaN-Based HBT]

The method for making the GaN-based HBT according to the third embodiment is the same as the method for making the GaN-based HBT according to the first embodiment except that the p-type GaN layer 81 is formed between the n-type GaN layer 16 and the n$^+$-type GaN layer 17.

According to the third embodiment, following advantages can be obtained in addition to the same advantages as the first embodiment. That is, as shown in FIG. 33, a slope of the energy band of the n$^+$-type GaN layer 17 is drastically decreased, so that the electric field applied to the n$^+$-type GaN layer 17 is drastically relaxed. Therefore, it is possible to suppress intervalley scattering and optical phonon scattering in the n$^+$-type GaN layer 17 and make the speed of the GaN-based HBT high.

Heretofore, embodiments of the present invention have been explained specifically. However, the present invention is not limited to these embodiments, but contemplates various changes and modifications based on the technical idea of the present invention.

For example, numerical numbers, structures, shapes, materials, etc. presented in the aforementioned embodiments are only examples, and the different numerical numbers, structures, shapes, materials, etc. may be used as needed.

EXPLANATION OF REFERENCE NUMERALS

11 $n^+$-type GaN layer
12 n-type GaN layer
13 Undoped $Al_xGa_{1-x}N$ layer
14 Undoped GaN layer
15 p-type GaN layer
16 n-type GaN layer
17 $n^+$-type GaN layer
18 Emitter electrode
19 Base electrode
20 Collector electrode
23 Two-dimensional electron gas
24 Two-dimensional hole gas
25 Base pad electrode
26 Collector pad electrode
27 High resistance layer
31 n-type GaN substrate
41 Base substrate
71 $Al_yGa_{1-y}N$ graded layer
81 p-type GaN layer

The invention claimed is:

1. A hetero-junction bipolar transistor, comprising:
a first n-type GaN layer;
an $Al_xGa_{1-x}N$ layer ($0.1 \leq x \leq 0.5$) on the first n-type GaN layer;
an undoped GaN layer having a thickness of not less than 20 nm on the $Al_xGa_{1-x}N$ layer;
a Mg-doped p-type GaN layer having a thickness of not less than 100 nm on the undoped GaN layer;
a second n-type GaN layer on the p-type GaN layer;
an emitter electrode electrically connected to the first n-type GaN layer;
a base electrode electrically connected to the p-type GaN layer; and
a collector electrode electrically connected to the second n-type GaN layer,
an emitter being formed by the first n-type GaN layer and the $Al_xGa_{1-x}N$ layer, a base being formed by the undoped GaN layer and the p-type GaN layer and a collector being formed by the second n-type GaN layer,
two-dimensional hole gas being formed in a part of the undoped GaN layer near the hetero interface between the $Al_xGa_{1-x}N$ layer and the undoped GaN layer during non-operation,
$p \times b \times 10^{-7} + P_s \geq 1 \times 10^{13}$ [$cm^{-2}$] being satisfied where b denotes the thickness of the p-type GaN layer, p denotes the hole concentration of the p-type GaN layer and $P_s$ denotes the concentration of the two-dimensional hole gas.

2. The hetero-junction bipolar transistor according to claim 1 wherein when the concentration of Mg doped with the p-type GaN layer is denoted as $N_{Mg}$ [$cm^{-3}$] and the electrical activation ratio of Mg doped with the p-type GaN layer is denoted as r, $N_{Mg} \times r \times b \times 10^{-7} + P_s \geq 1 \times 10^{13}$ [$cm^{-2}$] is satisfied.

3. The hetero-junction bipolar transistor according to claim 2 wherein the Al composition x and the thickness t [nm] of the $Al_xGa_{1-x}N$ layer satisfy the following equation $t \geq \alpha x^\beta$ where $\alpha$ and $\beta$ are numerals determined depending on necessary $P_s$.

4. The hetero-junction bipolar transistor according to claim 3 wherein when $P_s \geq 5 \times 10^{12}$ [$cm^{-2}$], the Al composition x and the thickness t [nm] of the $Al_xGa_{1-x}N$ layer satisfy the following equation:

$t \geq 11290 x^{-1.865}$.

5. The hetero-junction bipolar transistor according to claim 2 wherein $5 \times 10^{19}$ [$cm^{-3}$] $\leq N_{Mg} \leq 9 \times 10^{19}$ [$cm^{-3}$] is satisfied.

6. The hetero-junction bipolar transistor according to claim 1 wherein the first n-type is formed on a first $n^+$-type GaN layer, the second n-type GaN layer is formed on the p-type GaN layer like a mesa and a second $n^+$-type GaN layer is formed on the second n-type GaN layer.

7. The hetero-junction bipolar transistor according to claim 6 wherein the emitter electrode is formed on a surface of the first $n^+$-type GaN layer opposite to the first n-type GaN layer, the base electrode is formed on the part of the p-type GaN layer on which no second n-type GaN layer is formed and the collector electrode is formed on the second $n^+$-type GaN layer.

8. The hetero-junction bipolar transistor according to claim 1 wherein an $Al_yGa_{1-y}N$ graded layer is formed between the $Al_xGa_{1-x}N$ layer and the undoped GaN layer, the Al composition y of the $Al_yGa_{1-y}N$ graded layer decreasing monotonically from x to 0 in the direction from the $Al_xGa_{1-x}N$ layer to the undoped GaN layer.

9. The hetero-junction bipolar transistor according to claim 6, further comprising a p-type GaN layer formed between the second n-type GaN layer and the second $n^+$-type GaN layer.

* * * * *